(12) United States Patent
Umino et al.

(10) Patent No.: US 8,789,005 B1
(45) Date of Patent: Jul. 22, 2014

(54) METHOD AND APPARATUS FOR EFFICIENTLY PROCESSING AN INTEGRATED CIRCUIT LAYOUT

(75) Inventors: Kimiko Umino, Yokohama (JP); David C. Noice, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/463,817

(22) Filed: May 4, 2012

(51) Int. Cl.
*G06F 17/50* (2006.01)
(52) U.S. Cl.
USPC .......................................... 716/135; 716/134
(58) Field of Classification Search
USPC ................................................ 716/132–135
See application file for complete search history.

(56) References Cited

U.S. PATENT DOCUMENTS

| | | | |
|---|---|---|---|
| 7,669,169 B2 * | 2/2010 | Falbo et al. ...................... 716/50 |
| 8,074,187 B2 * | 12/2011 | Ylinen et al. ................... 716/54 |
| 8,161,425 B1 | 4/2012 | Noice et al. |
| 2003/0061592 A1* | 3/2003 | Agrawal et al. ................. 716/19 |
| 2003/0110461 A1* | 6/2003 | Inui et al. ........................... 716/5 |
| 2004/0019862 A1* | 1/2004 | Li et al. ............................. 716/5 |
| 2004/0064797 A1* | 4/2004 | Li ....................................... 716/5 |

OTHER PUBLICATIONS

U.S. Appl. No. 13/463,816, filed May 4, 2012, Noice, David C.
U.S. Appl. No. 13/463,816, May 17, 2012, Noice, David C.
U.S. Appl. No. 13/463,816, May 14, 2013, Noice, David C.

* cited by examiner

*Primary Examiner* — Binh Tat
(74) *Attorney, Agent, or Firm* — Vista IP Law Group, LLP

(57) ABSTRACT

A method for efficiently processing a design layout is described. In some embodiments, the method receives an original design layout and a modified design layout. The method identifies a change from the original design layout to the modified design layout by comparing the original and modified design layouts. The method of some embodiments then defines a region based on the location of the identified change within the modified design layout. The method performs a design operation (e.g., placing fills) only on the identified region of the modified design layout.

21 Claims, 20 Drawing Sheets

METHOD AND APPARATUS FOR EFFICIENTLY PROCESSING AN INTEGRATED CIRCUIT LAYOUT

CROSS REFERENCE TO RELATED APPLICATION

This Application is related to the following application: U.S. patent application Ser. No. 13/463,816, filed May 4, 2012.

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this fashion, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries or shapes of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

The process of producing these circuit components and/or wiring on an IC often results in circuit components and/or wiring that have different heights for the same layer of the IC. Because an IC typically has several layers that are stacked one on top of each other, it is desirable to have circuit components and/or wiring to have the same height along the entire layer of the IC (i.e., to have a flat surface along the entire layer). This ensures that subsequently placed layers of the IC remain parallel to the other layers of the IC.

To produce a layer of an IC with a flat surface (e.g., global planarization of the layer), a chemical mechanical polishing ("CMP") process is performed after the circuit components and/or wiring are produced on a layer of the IC. As the name implies, a CMP process is a procedure that polishes the layers of the IC to flatten the surface of the layer of the IC. Typically, the CMP process uses an abrasive and/or corrosive slurry that removes excess topological features (e.g., circuit components that extend beyond a certain height above the surface of a particular layer) of the layers of the IC.

However, CMP is a density sensitive process. In particular, the CMP requires that the density of the layer of the IC be within a minimum and maximum range. In other words, for the CMP process to be effective, the density of the IC layer has to be within a particular density range. Ideally, the density of the layer should be uniform throughout the entire layer. The density of the IC layer can be defined as the total area of the circuit components and wiring divided by the total area of the IC layer. When the density of the layer is not uniform or is not within the particular range, some of the side effects of the CMP process may include removing essential topological features (e.g., circuit elements) of the IC layer.

To resolve this issue, design engineers insert fills in certain regions of the IC layer in the design layout to create uniform density throughout the entire IC layer and/or to ensure that local regions of the IC layers meet the minimum density values for the CMP process. When fabricated, these fills are inactive and non-functional materials that are inserted between wiring and circuit components.

To prepare a design layout with fills inserted, design engineers have been following a typical process as illustrated in FIG. 1 using EDA applications. FIG. 1 conceptually illustrates a process 100 that one or more EDA applications perform to produce a design layout. The process 100 will be described by reference to FIG. 2 which conceptually illustrates in six different stages 201-206 a region 200 of a design layout that is being changed as the process 100 is being performed. The process 100 starts when the process receives logical or circuit descriptions of the IC's components.

The process 100 begins by performing placing and routing (at 105). As the name suggests, placing and routing involves two operations—placing and routing. In the placing operation, the process 100 converts the circuit representation of the IC into a geometric representation of the IC (i.e., a design layout of the IC). Specifically, the process 100 identifies the position of geometries (e.g., circuit modules geometries) or shapes on the design layout. The process 100 also abides by a set of design rules (e.g., minimum spacing rule which defines a minimum distance for two adjacent shapes to have in a design layout) when identifying the positions of the shapes. The process 100 performs the placing operation based on information contained in a design file (e.g., LEF/DEF file). A design file contains information regarding the physical design of the IC.

After performing the placement operation, the process performs a routing operation. In the routing operation, the process 100 specifies different regions in the routing space through which a wire (i.e., a net) should be routed. The process 100 also defines routes that connect the routable elements (e.g., pins) in the layout. The process 100 defines the routes while abiding by a set of design rules.

The process 100 identifies (at 110) one or more potential critical nets without knowing where the fill shapes will be placed in the design layout. That is, the process 100 identifies the potential critical nets without considering the locations of the fills to be placed in the design layout. A critical net is a net of which the timing is "critical" for several different reasons. For instance, a net is a critical net when the required delay of the net for the circuit to function properly is shorter than the actual delay of the net. That is, a net is critical when the time the net takes to transmit a signal is longer than the required time for the circuit to function properly. Such a net has a negative slack because the slack computed by subtracting the actual delay from the required delay has a negative value. A net is also a critical net when the circuit's proper functioning is sensitive to signal delays of the net. For instance, a clock net that is to transmit a clock signal is a critical net because the circuit's proper functionality will be affected by even a small amount of delay of the clock signal. Similarly, an analog net that is to transmit an analog signal is a critical net. The process 100 identifies, as potential critical nets, the nets that have negative slacks, the nets that will likely have negative slacks once the fills are placed near the nets (i.e., the nets that have small positive slacks), and the nets that are critical for other reasons (e.g., a clock net).

Next, the process 100 places (at 115) fills between the nets of the design layout but away from the potential critical nets identified at 110 in order to avoid making the delays of the potential critical nets longer. The process 100 places fills farther away from the identified nets than from other nets which are not deemed critical. The process 100 defines a distance within which the fills should not be placed from the identified nets. The process 100 defines this distance based on estimation of (i.e., prediction on) the impact of the fills on the delays of the identified nets. The process 100 may also define a region around the identified nets and does not place fills within the defined region. The process 100 defines the region based on estimation of the impact of the fills on the delays of the identified nets. When defining the distance or the region, the process 100 uses a fixed strategy. For instance, the process 100 defines a first distance for the nets in a first layer of the design layout and defines a second distance for the nets in a second layer of the design layout.

Stage 201 of FIG. 2 illustrates that the region 200 of the design layout includes two nets 210 and 215. At stage 202, the net 210 is colored black to conceptually indicate that the net 210 is identified as a potential critical net. Stage 203 illustrates that a region 220, depicted as a dotted rectangle, is defined around the net 210 based on an estimation of the impact of the fills on the delays of the net 210. The region 220 is defined such that the fills, depicted as white rectangles, are placed farther away from the net 210 than from the net 215. As shown, no fills are placed within the region 220 around the net 210. As a result, the fills are farther away from the net 210 than from the net 215.

Next, the process 100 performs (at 120) RC extraction and timing analysis. That is, the process 100 extracts resistance and capacitance information from the design layout, and use the extracted information to verify that the design of the IC meets certain operational requirements. These requirements include performance objectives and physical constraints. For example, a net may have a required delay of a signal passing through the net. The process 100 computes the actual delay of the signal based on the extracted information and compares the actual delay with the required delay to determine whether the actual delay satisfies the required delay. Stage 204 of FIG. 2 conceptually illustrates RC extraction. As shown, resistances parasitic to the nets and fills and the parasitic capacitances between the nets and the fills are conceptually illustrated as resistor and capacitor symbols.

The process 100 then determines (at 125) whether there is a timing violation in the design layout. The process 100 determines that there is a timing violation when there is a net whose actual delay is longer than the net's required delay. The process 100 determines that there is no timing violation when no net has an actual delay that is longer than the net's required delay. When the process 100 determines (at 125) that there is no timing violation, the process ends. When the process 100 determines (at 125) that there is a timing violation, the process loops back to 110 to perform operations 110-120 again to remedy the timing violation. Stages 205 of FIG. 2 illustrates that the net 215 has been identified as a critical net. Stage 206 illustrates that a region 225 is defined around the net 215 and no fills are placed within the region 225.

As illustrated in FIG. 1, the process 100 may have to perform several iterations of operations 110-120 in order to fix all timing violations. Taking several iterations of these operations consumes much time because identifying potential critical nets 110, inserting fills away from the potential critical nets 115, and the RC extraction and timing analysis 115 are typically time-consuming operations to perform. The process 100 in some cases has to go back 105 when several iterations of operations 110-120 cannot fix the timing violations.

Moreover, the likelihood of having to perform multiple iterations of operations 110-120 is high for several reasons. First, the distance from the critical nets defined at 115 to place the fills away from the critical nets may not be accurate because the distance is defined based on an estimation of impact of the fills on the delays of the critical nets. Second, identifying too many regions from which to exclude fills in operation 115 may not leave enough room in the design layout in which to put fills to meet the minimum density for a region of the design layout. Third, in the operation 110, guessing on timing impact of fills on nets may result in identifying the wrong nets as potential critical nets and placing fills near the actual critical nets. As shown in FIG. 2, the net 215 has turned out to be a critical net after placing the fills in the design layout. Also, the net 210 has turned out to be a non-critical net after placing the fills.

BRIEF SUMMARY

Some embodiments of the invention provide a method for efficiently producing a design layout that includes several fills between and around nets of the design layout. The method of some embodiments first places a set of fills in the design layout. The method then performs a timing analysis on the design layout to find out the actual impact of the fills on the timing of the nets. The method identifies a region of the design layout in which to trim a set of fills in order to fix any timing violations of the nets. The method then trims the set of fills in the identified region.

Based on the result of the timing analysis on the nets, the method identifies the nets that have timing violations (e.g., the nets that have actual delays that are longer than the nets' respective required delays). The method selects one of the identified nets and defines a region around the selected net. The method then trims the fills within the defined region in order to resolve the timing violation of the selected net. In some embodiments, the method trims the fills by removing the fills or the portions of the fills that fall within the defined region.

In some embodiments, the method trims the fills in the region that are closest to the selected net first. The method then checks whether the region satisfies the required minimum density. When the method satisfies the required minimum density, the method trims more fills in the region. The method repeats trimming and checking until the required minimum density is not satisfied. The method then selects another one of the identified nets, defines another region, and repeats trimming and checking for the other region.

When selecting a net from the nets that have timing violations, different embodiments select the net differently. For instance, the method of some embodiments prioritizes the nets based on the severity of timing violations that the nets have. That is, the method first selects a net that has the biggest difference between the required delay and the actual delay that is longer than the required delay. The method then selects another net that has the second biggest such difference. In other embodiments, the method prioritizes the nets based on other criteria or no criteria. For instance, the method selects the nets that have timing violations in a random order.

The method of some embodiments specifies different amounts of trimming for different nets. For instance, the method uses different distances and/or numbers of layers above or below to trim fills for different nets. In some embodiments, the method specifies an amount of trimming for a net based on the type of the net or based on the amount of slacks of the net.

The method of some embodiments specifies different amounts of trimming on different areas around a single net. For instance, the method trims the fills that are within a first distance from a first portion of the single net. The method trims the fills that are within a second distance, which is longer than the first distance, from a second portion of the single net when a second area around the second portion of the net has a higher density than a first area around the first portion does.

In some embodiments, the method is performed by an EDA application. The EDA application provides a user with an interface (e.g., a command-line interface or a graphical user interface) that the user can use to specify the manner in which the method should be performed. For instance, the user can select a net around which to define a region using the interface. The user can also specify the minimum density for the region to meet. The user can also specify the criteria based on which the EDA application selects a net around which to define a region.

Some embodiments of the invention provide a method for efficiently changing a design layout by incrementally processing the design layout after a change is made to the design layout. In some embodiments, the method modifies an original design layout to generate a modified design layout. The method then compares the original design layout and the modified design layout to identify all the changes made. The method then defines regions on the identified changes. The method then performs a set of design operations (e.g., verifying against design rules, performing an RC extraction, placing fills, etc.) only on the defined region and not on the entire of the design layout. In this manner, the method shortens the time to perform the set of design operations by avoiding performing the operations on the entire of the design layout. The time saving is more pronounced when time to perform the set of design operations gets longer proportionally to the size of a region on which to perform the operations.

In some embodiments, the method modifies the design layout by changing the shapes in the design layout. As mentioned above, shapes in a design layout represent the features, nets, fills, etc. The method changes the shapes by adding new shapes to the design layout, removing existing shapes from the design layout, or removing or adding portions of the shapes to and from the layout. The method of some embodiments stores the design layout before making any changes to the shape. After modifying the design layout, the method compares the modified design layout with the stored design layout to identify the changed shapes. Once the changed shapes are identified, the method of some embodiments defines a region that includes the changed shapes. The method then performs a set of design operations only to the defined region.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Figure 3:
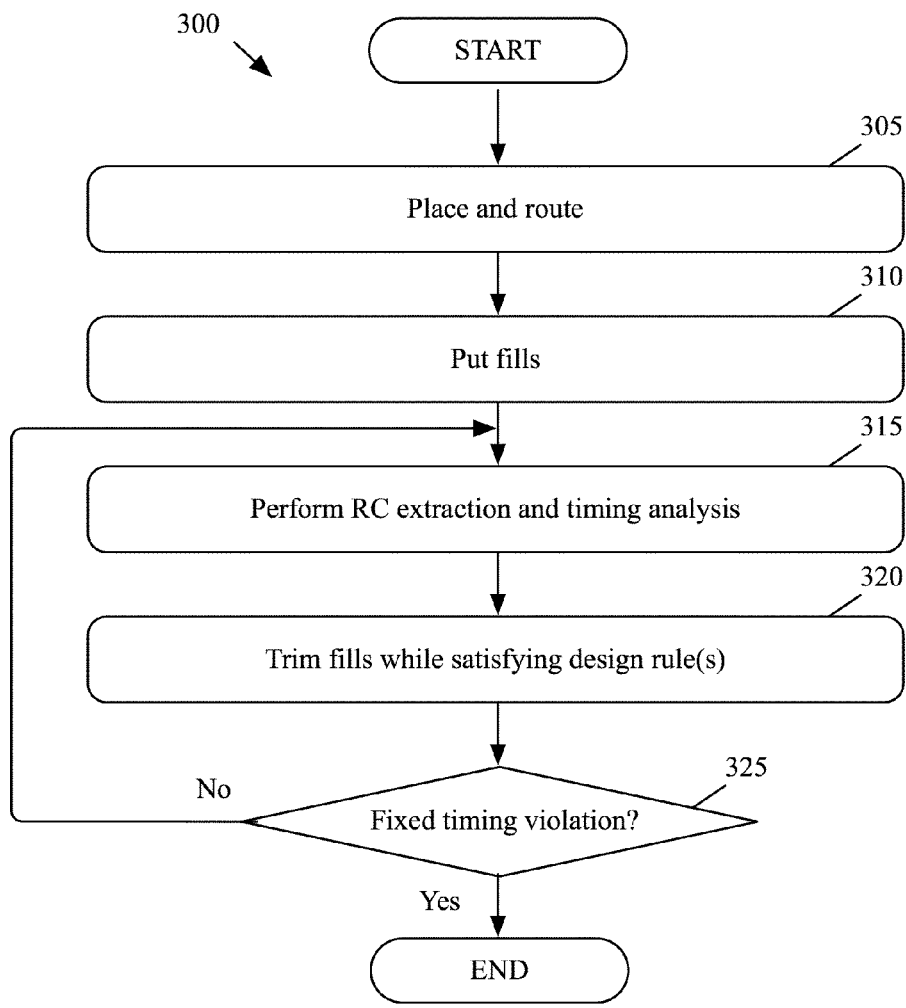
FIG. 3 conceptually illustrates a process that some embodiments perform to efficiently produce a design layout.

Some embodiments of the invention provide a method for efficiently producing a design layout. In some embodiments, the method produces the design layout that includes a set of fills by placing the fills in the design layout first and then trimming the fills. FIG. 3 conceptually illustrates a process 300 that some embodiments perform to efficiently produce a design layout that includes several fills between nets of the design layout. The process 300 is performed by one or more EDA applications. The process 300 will be described by reference to FIG. 4 which illustrates in four different stages 401-404 a region 400 of a design layout that is being changed as the process 300 is being performed. The process 300 starts when the process receives logical or circuit descriptions of the integrated circuit's (IC's) components.

Figure 1:
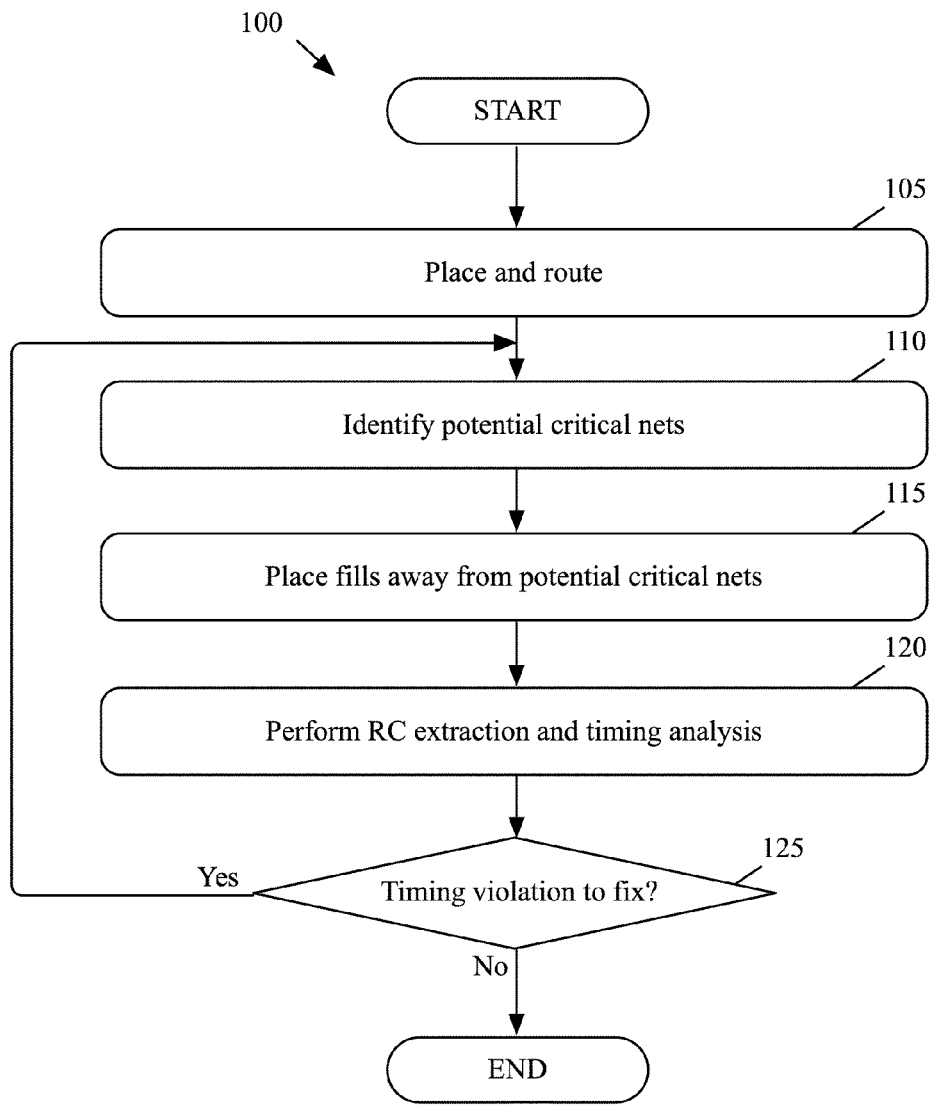
FIG. 1 conceptually illustrates a process that some embodiments perform to produce a design layout.
Figure 2:
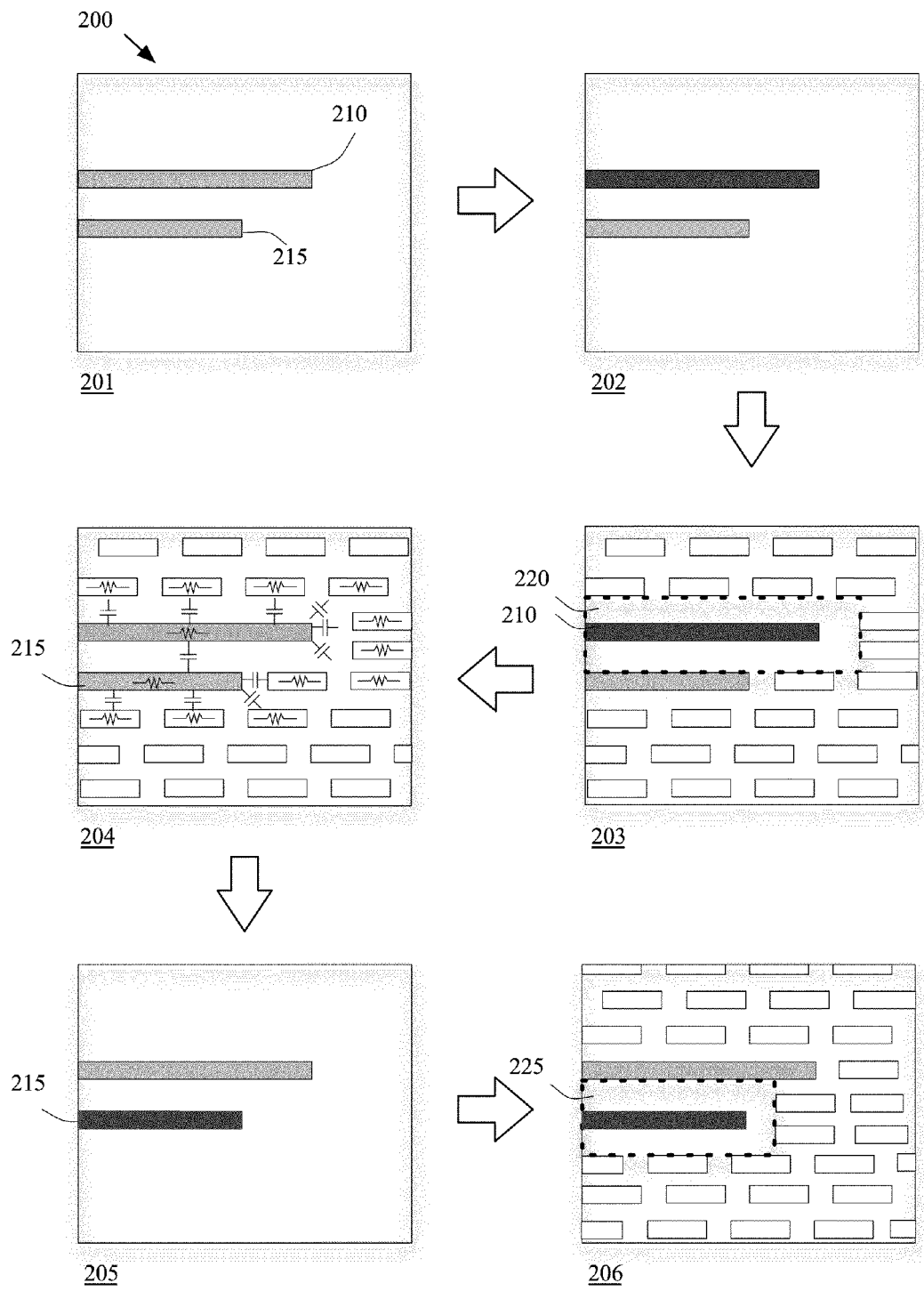
FIG. 2 conceptually illustrates a region of a design layout that is being changed.
Figure 4:
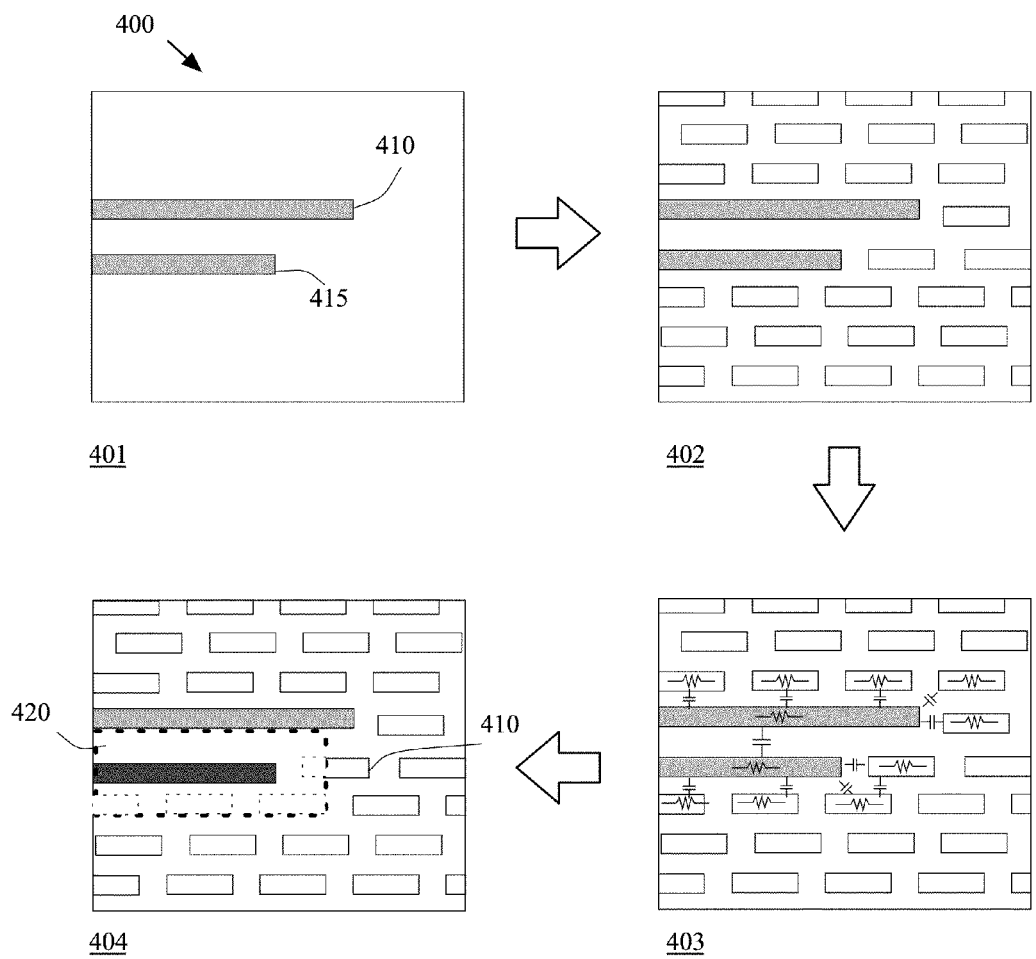
FIG. 4 conceptually illustrates a region of a design layout that is being changed.

The process 300 begins by performing placing and routing (at 105). The operation 305 of the process 300 is similar to the operation 105 of the process 100 described above by reference to FIG. 1. That is, the process 300 identifies positions of the shapes that represent components of the IC in a design layout and routes the shapes with another set of shapes that represent wires or nets. Throughout this application, "shapes" are interchangeably used with the circuit elements, nets and fills in the context of design layouts unless otherwise specified. Stage 401 of FIG. 4 illustrates a region 400 which includes two nets 410 and 415.

Back to FIG. 3, the process 300 then places (at 310) fills between the shapes of the design layout. However, in contrast with the operations 110 and 115 of the process 100 described above, the process 300 places (at 310) the fills without considering the impact of the fills on the timing of the nets. That is, the process 200 does not avoid placing fills near the potential critical nets. As illustrated by stage 402, the fills (conceptually depicted as white rectangles) are placed in the region 400 of the design layout. No region around the nets 410 and 415 are blocked.

Next, the process 300 performs (at 315) RC extraction and timing analysis. The operation 315 of the process 300 is similar to the operation 115 of the process 100. The process 300 in some embodiments computes the slacks for the nets using the extracted information. Stage 403 of FIG. 4 conceptually illustrates RC extraction. As shown, parasitic effects (parasitic resistance of the nets and fills and the parasitic capacitances between the nets and the fills) are conceptually illustrated as resistor and capacitor symbols.

The process 300 then trims (at 320) the fills. In some embodiments, the process 300 trims the fills around all nets that have timing violations in order to reduce the impact of the fills on the timing of the nets. In some embodiments, the process 300 first selects a net that has the longest negative slack and defines a region around the selected net. The defined region is a region that is within a certain distance from the net in some embodiments. This distance may be specified by the process 300 according to a default distance or the distance may be specified by a user as will be described in detail further below. Stage 404 of FIG. 4 illustrates that the net 415 is selected and the fills around the net 415 are trimmed. The net 415 is colored black to indicate the selection. As shown in this stage, fills or portions of fills in the region 420 are removed from the design layout.

The process 300 trims (at 320) the fills while satisfying one or more design rules. For example, the process 300 keeps trimming the fills in the region as long as the region meets the required minimum density. As another example, the process 300 may trim the fills in the region that do not meet a minimum spacing rule.

At 320, the process 300 may also employ several different "trimming strategies" on different areas around a single net. For instance, the process 300 in some embodiments can use different distances and/or numbers of layers above or below to trim fills for different areas around the single net. More specifically, the process 300 may trim the fills that are within a first distance from a first portion of the single net. Then, the process 300 may trim the fills that are within a second distance, which is longer than the first distance, from a second portion of the single net when a second area around the second portion of the net has a higher density than a first area around the first portion does. Similarly, the process 300 may trim the fills in the areas corresponding to the first area in one upper layer and in one lower layer and then trim the fills in the areas corresponding to the second area in the two upper layers and two lower layers.

Moreover, the process 300 at 320 may also use different trimming strategies for different types (e.g., clock net, analog net, etc.) of critical nets or for different amount of slacks of critical nets. For instance, the process 300 may use a first trimming strategy for a first net and use a second different trimming strategy (e.g., trimming within longer distance and/ or in more layers) for a second net that has a longer negative slack than the first net does.

When the process 300 is done with a net, the process 300 moves on to process another net that has a timing violation. In this manner, the process 300 in some embodiments trims the fills around all the critical nets.

The process 300 then determines (at 325) whether the nets still have timing violations. That is, the process 300 determines whether the nets still have negative slacks. When the process 300 determines (at 325) that there is no timing violation, the process ends. When the process 300 determines (at 325) that there is a timing violation in the design layout, the process loops back to 315 to perform trimming and timing analysis again to remedy the timing violation.

The process 300 consumes much less time to perform than the process 100 does, mainly because the likelihood of having to perform multiple iterations of the operations 315 and 320 is much less than the likelihood of having to perform multiple iterations of the operations 110-120. This is because predicting the impact of the fills on the timing of the nets to identify potential critical nets at 110 and keeping fills away from the potential critical nets at 115 are prone to error, which causes timing violations that take multiple iterations to correct. Also, the amount of space to keep fills away from the critical nets does not vary depending on how critical the nets are. As mentioned above, the process 100 at 115 uses a fixed strategy when defining a distance by which to keep the fills away from potential critical nets.

Typically, the amount of time to perform each iteration of the operations 110-120 is in hours. In contrast, trimming fills at 320 takes very short time (e.g., in minutes). Moreover, the process 300 computes the actual delays of the nets by factoring in the real impact of the fills on the timing of the nets. Because the real impact of the fills on the timing of the nets are used to compute the actual delays of the nets, there is no prediction error, and one iteration of the operations 315 and 320 is usually sufficient to remove all timing violations. Moreover, the different trimming strategies that the process 300 employs at 320 (and/or at 315 during RC extraction and timing analysis in some embodiments) usually takes very short time (e.g., seconds) to perform. The process 300 thereby saves hours of run-time in comparison with the process 100.

One of ordinary skill in the art will recognize that process 300 is a conceptual representation of the operations used to efficiently produce a design layout. The specific operations of process 300 may not be performed in the exact order shown and described. The specific operations need not be performed in one continuous series of operations, and different specific operations may be performed in different embodiments. Furthermore, the process could be implemented using several sub-processes, or as part of a larger macro process.

For instance, in some embodiments, the process 300 is performed by one or more EDA applications that execute on one or more computers. That is, the different specific operations may be performed by different EDA applications tailored to the different specific operations.

Moreover, the process 300 may perform RC extraction and timing analysis during performing placement and routing (at 305). With the result of this timing analysis, the process 300 can compute the actual amount of additional delays caused by the fills by comparing the result with the result of another timing analysis at 315 performed after placing (at 310) fills between the nets.

As mentioned above, the shapes that represent the fills in the design layout are depicted as rectangles in FIG. 4. It is to be noted that the shapes that represent the fills in the design layout may be any geometric shapes (e.g., squares, circular shapes, etc.).

Figure 5:
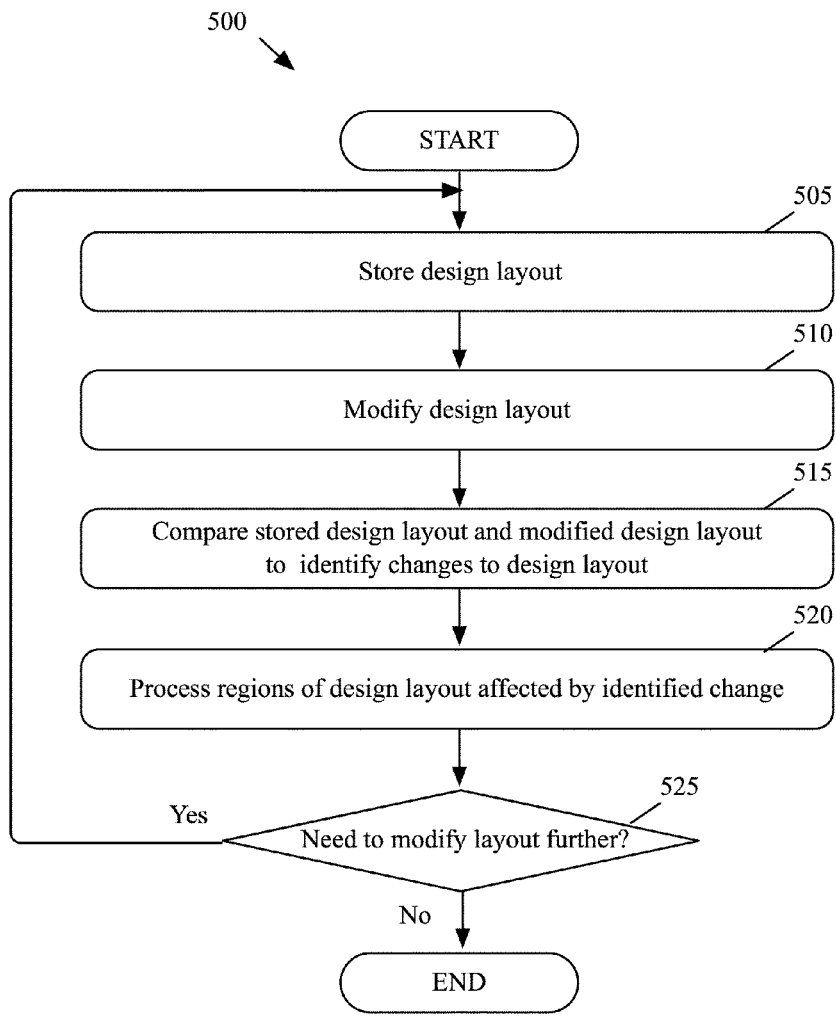
FIG. 5 conceptually illustrates a process that some embodiments perform to efficiently change a design layout.

Some embodiments provide a method for efficiently changing a design layout by incrementally processing the design layout after a change is made to the design layout. In some embodiments, the method produces the design layout by avoiding performing design operations on the entire of the design layout. FIG. 5 conceptually illustrates a process 500 that some embodiments perform to efficiently change a design layout. The process 500 is performed by one or more EDA applications in some embodiments. The process 500 will be described by reference to FIG. 6 which illustrates in four different stages 601-604 a region 600 of a design layout that is being changed as the process 500 is being performed. The process 500 starts when the process receives a design layout to process and change.

Figure 6:
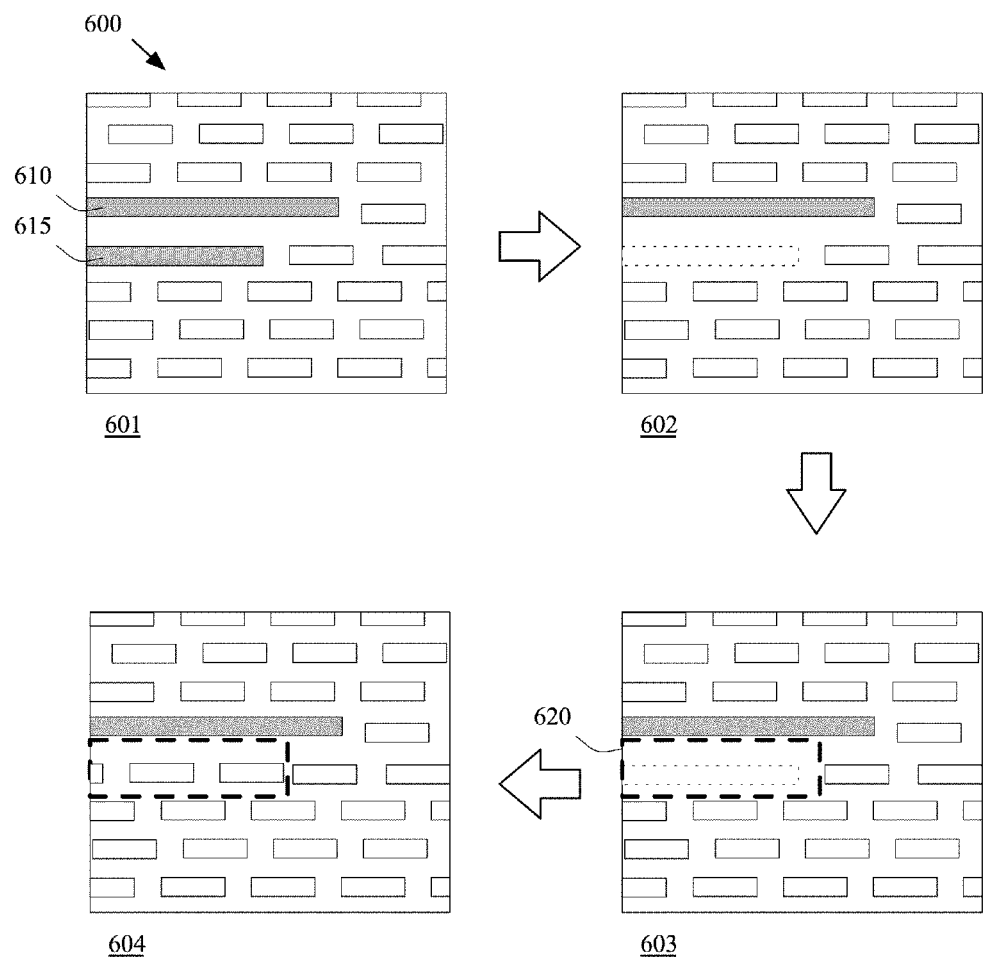
FIG. 6 conceptually illustrates a region of a design layout that is being changed.

The process 500 begins by storing (at 505) the design layout. In some embodiments, the process 500 keeps a copy of the design layout prior to making any changes to the design layout. For instance, stage 601 of FIG. 6 illustrates a region 600 of the design layout that is stored before making a change. As shown, the region includes nets 610 and 615 and a number of fills depicted as white rectangles.

The process 500 then modifies (at 510) the design layout. In some embodiments, the process 500 modifies the design layout by changing shapes in the design layout that represent components and nets of the IC. The process 500 changes these shapes by adding or removing the shapes or portions of the shapes. Stage 602 illustrates that net 615 has been removed from the region 600. The net 615 is depicted as dotted rectangle to indicate that the net 615 has been removed.

Next, the process 500 compares (515) the stored design layout and the modified design layout. Based on the comparison, the process 500 identifies a set of changes to the design layout. In some embodiments, the process 500 identifies regions of the modified design layout based on the identified changes. The regions identified by the process 500 includes the identified changes in some embodiments. Identifying regions of design layout based on the identified changes will be described in detail further below. In the example of FIG. 6, the process 500 compares a stored design layout that includes the region 600 illustrated by stage 601 and the modified design layout that includes the region illustrated by stage 602. By comparing the design layouts, the process 500 identifies that net 615 has been removed. The process 500 defines a region 620, depicted as thick dotted rectangle, that includes the location of the design layout that used to be occupied by the removed net 615.

The process 500 then processes (at 520) the identified regions. In some embodiments, the process 500 processes only the identified regions in order to avoid processing the entire of the design layout. Processing a region of design means performing a set of design operations on the design layout. These design operations that the process 500 may perform include, for example, verifying the region against a set of design rules, performing a timing analysis on the region, inserting fills in the region, etc. Stage 604 of FIG. 6 illustrates that the process 500 is performing an operation to insert fills only in the region 620.

Next, the process 500 determines (at 525) whether it is necessary to modify the design layout further. In some embodiments, the process 500 makes this determination based on the result of processing (at 625) the regions of the design layout. For instance, the process 500 determines that the design layout needs another change when the features or nets in the processed region does not or cannot satisfy a design rule (e.g., a minimum width for a net). When the process 500 determines (at 525) that it is not necessary to modify the design layout, the process ends. Otherwise, the process loops back to 505 to store the design layout before making another change.

By processing only the regions the design layout after making a change to a design layout, the process 500 saves much time that would have been spent otherwise for processing the entire of the design layout after making a change to the design layout.

Several more detailed embodiments of the invention are described in the sections below. Section I describes efficiently producing a design layout that includes a set of fills by placing the fills in the design layout first and then trimming the fills. Next, Section II describes efficiently making changes to a design layout by avoiding processing the entire of the design layout after each change to the design layout. Finally, Section III describes an electronic system that implements some embodiments of the invention.

I. Inserting and Trimming Fills

As mentioned above, some embodiments of the invention provide a novel method of efficiently producing a design layout that includes a set of fills by inserting the fills between the nets in the design layout and then trimming the fills. Section I will describe modules and processes that implement the novel method of different embodiments.

Figure 7:
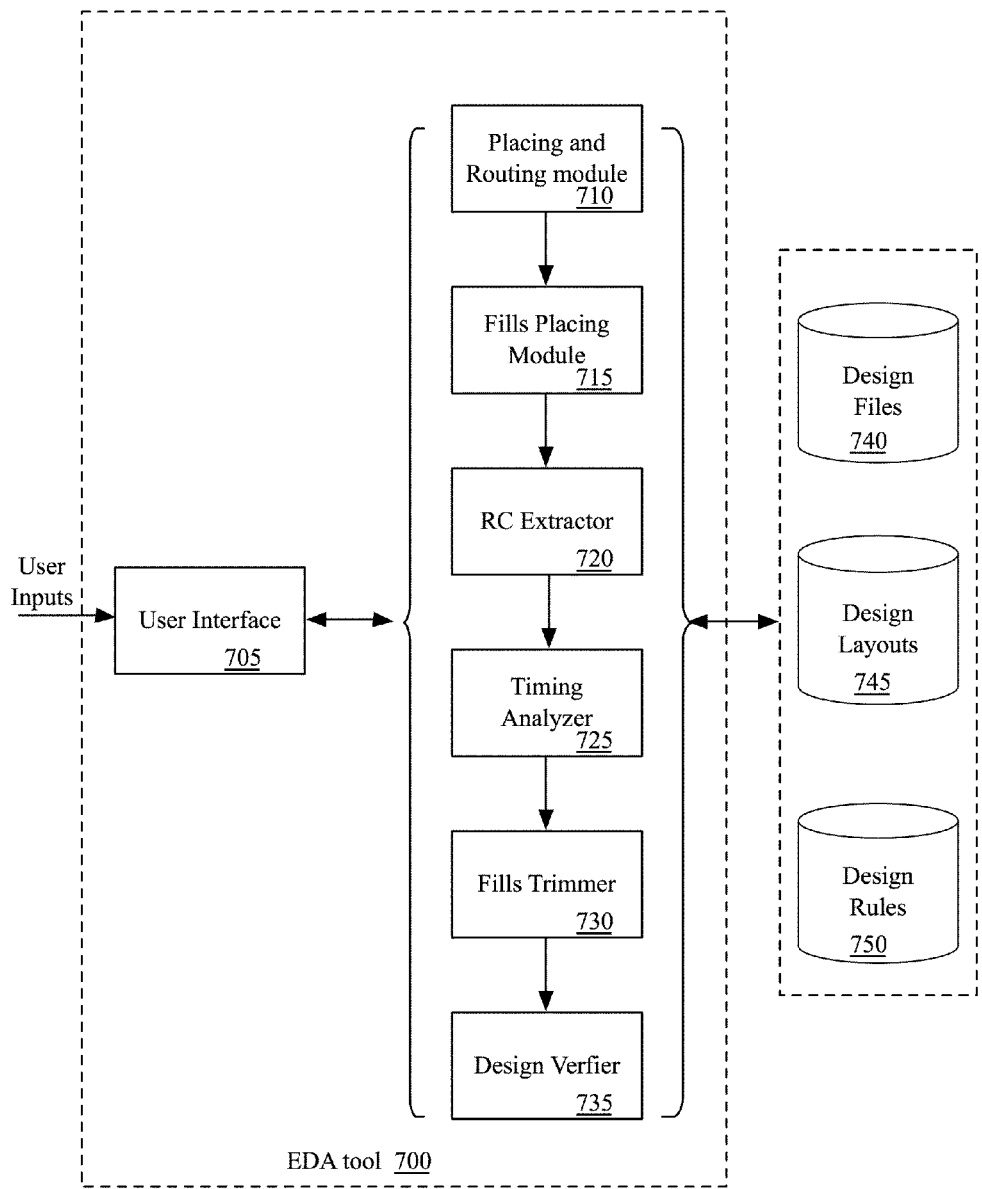
FIG. 7 conceptually illustrates example architecture for an EDA tool of some embodiments.

FIG. 7 conceptually illustrates example architecture for an EDA tool 700 that produce a design layout for an IC. Specifically, this figure illustrates that the EDA tool 700 in some embodiments efficiently produces a design layout by inserting the fills in the design layout and then trimming the fills. FIG. 7 also illustrates design files 740, design layouts 745, and design rules 750.

The design files 740 in some embodiments are files that contain circuit description of ICs. These files describe physical layouts of ICs to be converted to design layouts. In some embodiments, the design files are in Design Exchange Format (DEF) and Library Exchange Format (LEF). The design layouts 745 in some embodiments contain geometric descriptions of ICs being designed. In some embodiments, the design layout files are in GDS II stream format (GDSII). The design rules 750 in some embodiments contain the design policies that the design engineers specify in order to make the ICs function properly when fabricated. For example, the design specify a minimum distance between two shapes, a minimum width of a shape, a minimum density for a region of the design layout, etc. In some embodiments, the design rules are contained in files in the LEF.

The user interface 705 is an interface that the user can use to control the manner in which the EDA tool 700 perform to produce the design layout. Specifically, the user can provide parameters to the modules of the EDA tool 700. Some example parameters that the user may provide through the user interface 705 will be described in detail further below. In some embodiments, the user interface 705 is a command-line interface (CLI), a graphical user interface (GUI), or a combination of CLI and GUI.

As shown, the EDA tool 700 includes a placing and routing module 710, a fills placing module 715, an RC extractor 720, a timing analyzer 725, a fills trimmer 730, and a design verifier 735. In some embodiments, these modules of the EDA tool 700 are separate software applications running on the same or different computing devices. Also, some of the modules may be part of the same software application.

The placing and routing module 710 is for placing components of the IC in the design layout and routing the nets to connect the features. The placing and routing module 710 converts the circuit description of the IC into a geometric representation of the IC (i.e., a design layout of the IC). Specifically, the placing and routing module identifies the positions of the shapes representing the components of the IC in the design layout. In some embodiments, the placing and routing module 710 receives or retrieves the circuit representation of the IC as one or more design files 740. In some embodiments, the placing and routing module 710 also verifies the positions of the shapes against the design rules 750 while performing placing and routing operation.

The fills placing module 715 is for placing fills between the nets in the design layout prepared by the placing and routing module 710. As mentioned above, the fills may cause parasitic capacitance between the fills and nets and the parasitic capacitance may cause delay in the signals passing through the nets. The fills placing module 715 in some embodiments may be configured to consider the possible parasitic capacitance when identifying locations at which to place the fills. That is, the fills placing module 715 may select several nets that potentially have large slacks and not place the fills within a certain distance from the selected nets in order to minimize the possible parasitic capacitance between the fills and the selected nets.

In some embodiments, the fills placing module 715 places the fills between the nets without considering the impact of the fills on the timing of the nets. That is, the fills placing module 715 in these embodiments does not consider the effect of the proximity of the fills to the nets when placing the fills. The fills placing module 715 in these embodiments thereby saves computing resources (e.g., CPU cycles, memory, etc.) and time.

The RC extractor 720 extracts the parasitic resistance and the parasitic capacitance from the design layout, which includes the fills placed by the fills placing module 715. The RC extractor 720 computes the parasitic effects (e.g., parasitic resistance, parasitic capacitance) by solving Maxwell's equations. In some embodiments, the RC extractor is a conventional RC extraction tools such as FastCap, FastHenry, Cadence QRC™, etc.

The timing analyzer 725 performs timing analysis on the design layout based on the parasitic effects computed by the RC extractor 720. Specifically, the timing analyzer 725 computes slacks for the nets in the design layout in some embodiments.

The fills trimmer 730 trims the fills in the design layout that the fills placing module 715 have placed. In some embodiments, fills trimmer 730 trims the fills around all nets that have negative slacks in order to reduce the impact of the fills on the timing of the nets. In some embodiments, the fills trimmer 730 first selects a net that has the longest negative slack and defines a region around the selected net. The defined region is a region that is within a certain distance from the net. This distance may be specified by the user through the user interface 705.

In some embodiments, the fills trimmer 730 trims the fills while satisfying one or more design rules 750 using the design verifier 735. For instance, the fills trimmer 730 keeps trimming the fills in the region as long as the region meets the required minimum density. As another example, the fills trimmer 730 may trim the fills in the region that do not meet minimum spacing rule. When the fills trimmer 730 is done with a net, the fills trimmer 730 moves on to process another net that has a negative slack. In this manner, fills trimmer 730 in some embodiments trims the fills around all the nets that have timing violations. The fills trimmer 730 will be described in detail further below by reference to FIG. 9.

The design verifier 735 verifies the design layout against the design rules 750. When the design verifier 735 finds out that the design layout does not meet one or more of the design rules 750, the design verifier 735 in some embodiments passes the information to the placing and routing module 710 which may automatically fix some of the design violations. The design verifier 735 may also show the verification result to the user so that the user can make a decision as to whether to modify the design layout using the EDA tool 700.

Figure 8:
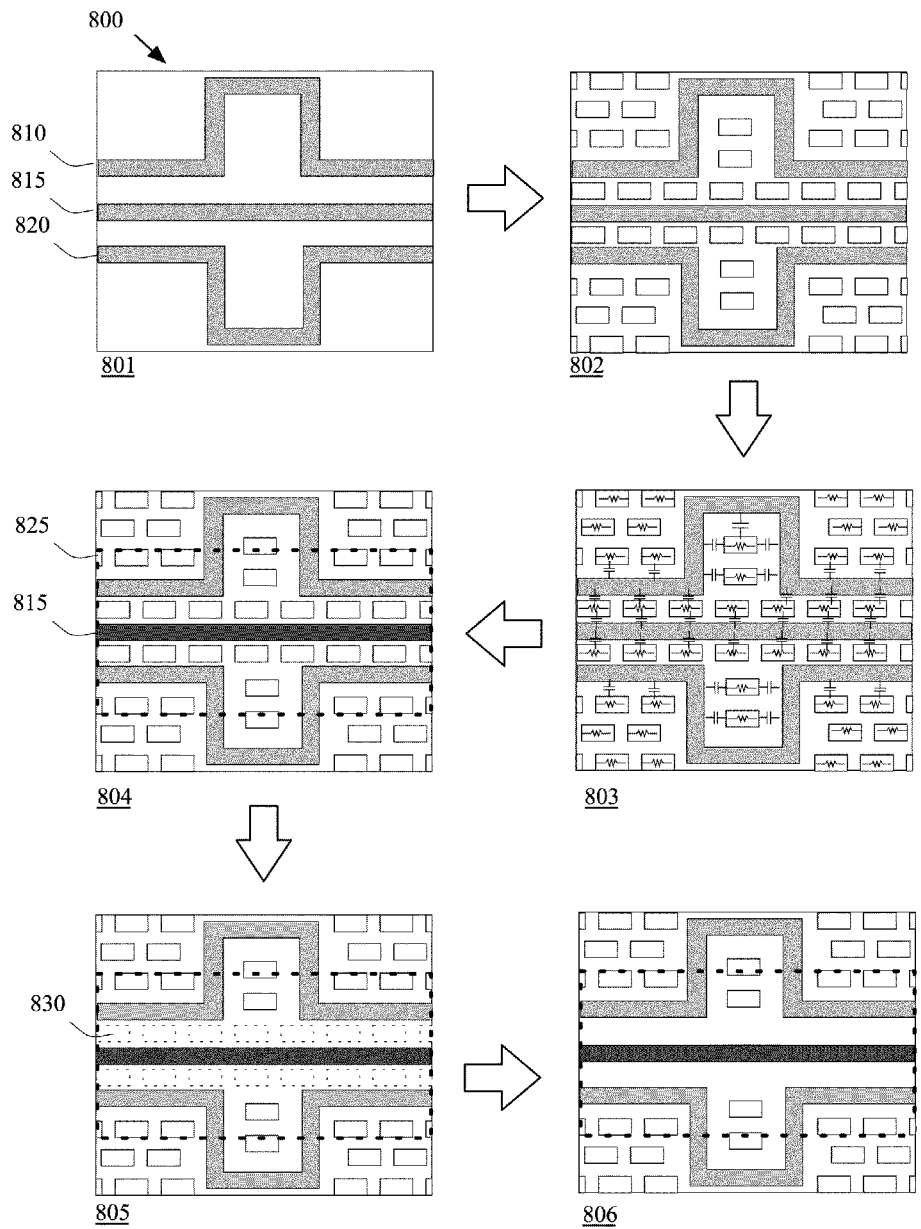
FIG. 8 conceptually illustrates a region of a design layout that is being changed.

An example operation of the EDA tool 700 will now be described by reference to FIG. 8. FIG. 8 conceptually illustrates in six different stages 801-806 a region 800 of a design layout that is being produced by the EDA tool 700. FIG. 8 illustrates that the region 800 includes three nets 810, 815, and 820, depicted in grey.

Stage 801 illustrates that the placing and routing module 710 has added the nets 810, 815, and 820 to the region 800. In this example, the placing and routing module 710 has generated the design layout from the circuit description of the IC. The region 800 shown in this figure is only a fraction of a layer of the design layout.

Next, stage 802 illustrates that the fills placing module 715 has inserted several fills between and around the nets 810, 815, and 820. In this example, the fills placing module 715 did not factor in the proximity of the fills to the nets.

Stage 803 illustrates that the RC extractor 720 has extracted the parasitic resistance and the parasitic capacitance from the design layout. These parasitic effects are depicted as capacitor and resistor symbols.

Using the extracted effects, the timing analyzer 725 computes the slacks for the nets 810, 815, and 820. That is, the timing analyzer 725 calculates the delay for each of the nets and compare the calculated delay with the required delay for the net to compute the difference between the calculated delay and the required delay. In this example, the net 815 has the largest such difference with the calculated delay being longer than the required delay (i.e., the largest slack). The net 815 is depicted in dark grey to indicate that the net 815 has the largest such difference among the three nets 810, 815, and 820 as shown by stage 804.

Stage 804 also illustrates the fills trimmer 730 has selected the net 810 and defined a region 825, depicted as thick dotted rectangle. In this example, the fills trimmer 730 has selected the net 810 because the net 810 has the longest slack and defined a region 825 such that the region 825 falls within a certain distance from the net 815. In this example, the user provides this distance through the user interface 705 and the fills trimmer 730 receives this distance from the user interface 705.

The fills trimmer 730 then starts trimming the fills from the region 825. The fills trimmer 730 uses the design verifier 735 to check the region 825 against a set of design rules. The design verifier 735 finds that some of the fills between the nets 810, 815, and 820 violates a minimum spacing rule because these fills are placed within the minimum distance, defined by the minimum spacing rule, from the nets. The fills trimmer 730 selects these fills 830 (depicted as dotted rectangles) as shown by stage 805. The design verifier 735 also determines that trimming the remaining fills in the region 825 will cause the region to go below a minimum density (specified by the user through the user interface 705) in this example. The fills trimmer 730 does not select the remaining fills (depicted as solid rectangles) in the region 825. Stage 806 shows that the fills trimmer 730 has removed the selected fills from the region 800.

Figure 9:
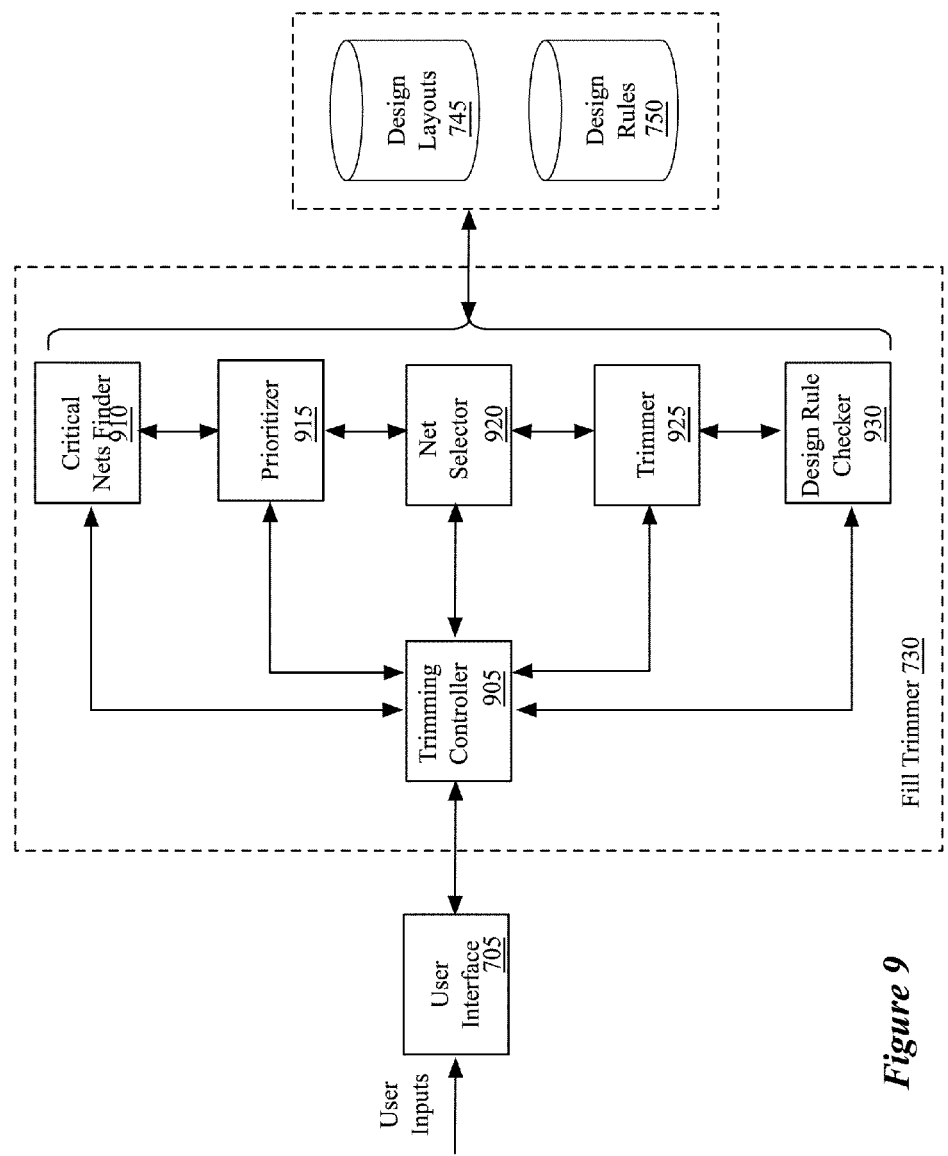
FIG. 9 conceptually illustrates example architecture for a fills trimmer of some embodiments.

FIG. 9 conceptually illustrates example architecture for the fills trimmer 730 described above by reference to FIG. 7. FIG. 9 also illustrates the user interface 705, the design layouts 745, and the design rules 750. As shown, the fills trimmer 730 includes a trimming controller 905, a critical nets finder 910, a prioritizer 915, a net selector 920, a trimmer 925, and a design rule checker 930.

The trimming controller 905 in some embodiments controls the trimming of the fills in the design layout based on the user inputs through the user interface 705. Through the user interface 705, the fills trimmer 730 provides the user with a set of possible inputs that the user can specify. The user can formulate different trimming strategies by varying the specifics of the inputs through the user interface 705.

The inputs may include a list of layers of the design layout within which to trim fills. The fills trimmer 730 trims the fills in the listed layers of the design layout only. The inputs include specification (e.g., a set of coordinates that define a vertical range and a horizontal range) of a region within a listed layer so that the fills trimmer 730 trims the fills in the specified region.

The inputs include a name of a net around which to trim fills. The inputs include the minimum density value (e.g., in terms of a percentage value) for the fills trimmer 730 to satisfy while trimming the fills. The inputs may also specify different minimum density values for different layers of the design layout. The inputs may specify that the fills trimmer 730 should trim around all clocks or specific clocks. The inputs may specify a region in which to create a fill blockage such that no fills will be placed in the region when fills placement operation is performed again for the region.

The inputs include a threshold slack. The fills trimmer 730 will trim all nets that have longer slacks than the threshold slack. The inputs also include a distance. When the user specifies the distance, the fills trimmer 730 trims all the fills and portions of the fills that fall within this distance from the critical nets. The inputs may also specify a distance for an upper layer. When the user specifies this distance for the upper layer, the fills trimmer 730 trims all the fills and portions of the fills that (1) are in the layer above the layer in which the critical nets are and (2) fall within this distance from the critical nets. The inputs may also specify a distance for a lower layer. When the user specifies this distance for the lower layer, the fills trimmer 730 trims all the fills and portions of the fills that (1) are in the layer below the layer in which the critical nets are and (2) fall within this distance from the critical nets.

The critical nets finder 910 receives or retrieves a design layout as directed by the trimming controller 905 and identifies all the critical nets in the design layout. The prioritizer 915 then prioritizes the critical nets. In some embodiments, the prioritizer 915 assigns the highest priority to a critical net that has the longest negative slack and assigns the lowest priority to a critical net that has the least negative slack. In other embodiments, the critical nets finder 910 prioritizes the nets based on criteria other than slacks or based on no criteria. In some embodiments, the prioritizer 915 orders the critical nets based on the negative slack values without assigning any priority to the nets or does not order the critical nets at all.

The net selector 920 selects one or more nets as directed by the trimming controller 905. The trimmer 925 then trims the fills around the selected nets. The trimmer 925 in some embodiments trims the fills around the selected nets in the order of highest priority to the lowest priority. When so directed by the trimming controller 905, the trimmer also trims the fills in the upper and lower layers of the layer in which the selected nets are located. In some embodiments, the trimmer 925 varies the amount of fills to trim and the number of layers to trim above or below based on the properties of the selected net. For instance, the trimmer 925 trims more fills in more layers of the design layout when the selected net has a larger negative slack, when the selected net is a special analog net for transmitting analog signals, or when the selected net is a special clock net for transmitting clock signals, etc.

The design rule checker 930 checks the selected nets and the fills around the selected nets against one or more design rules 750 while the trimmer 925 is trimming the fills. Using the design rule checker 930, the trimming controller 905 directs the trimmer 925 to trim the fills in order to avoid design rule violations.

Figure 10:
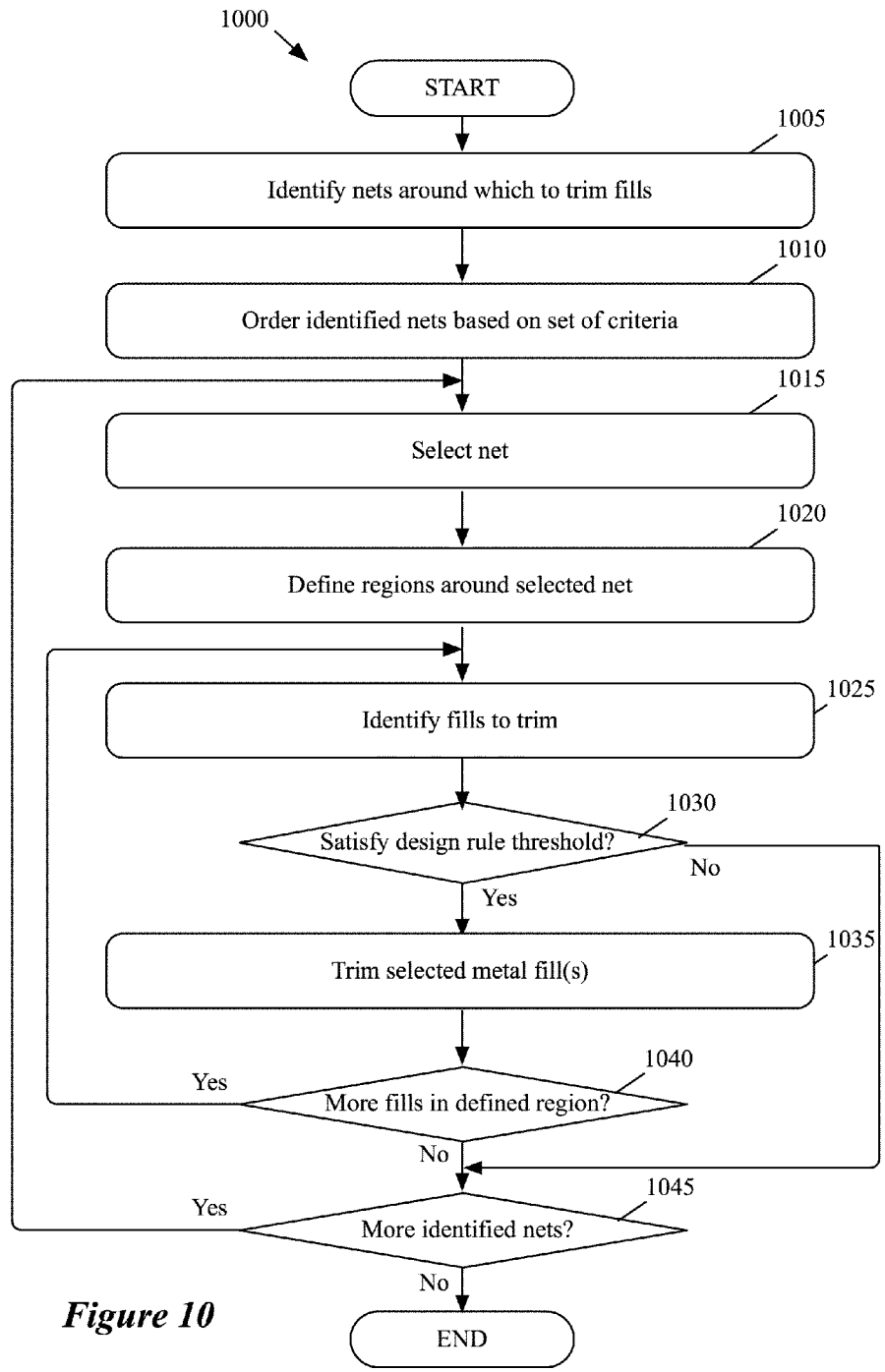
FIG. 10 conceptually illustrates a process that some embodiments perform to place fills in a design layout.
Figure 11:
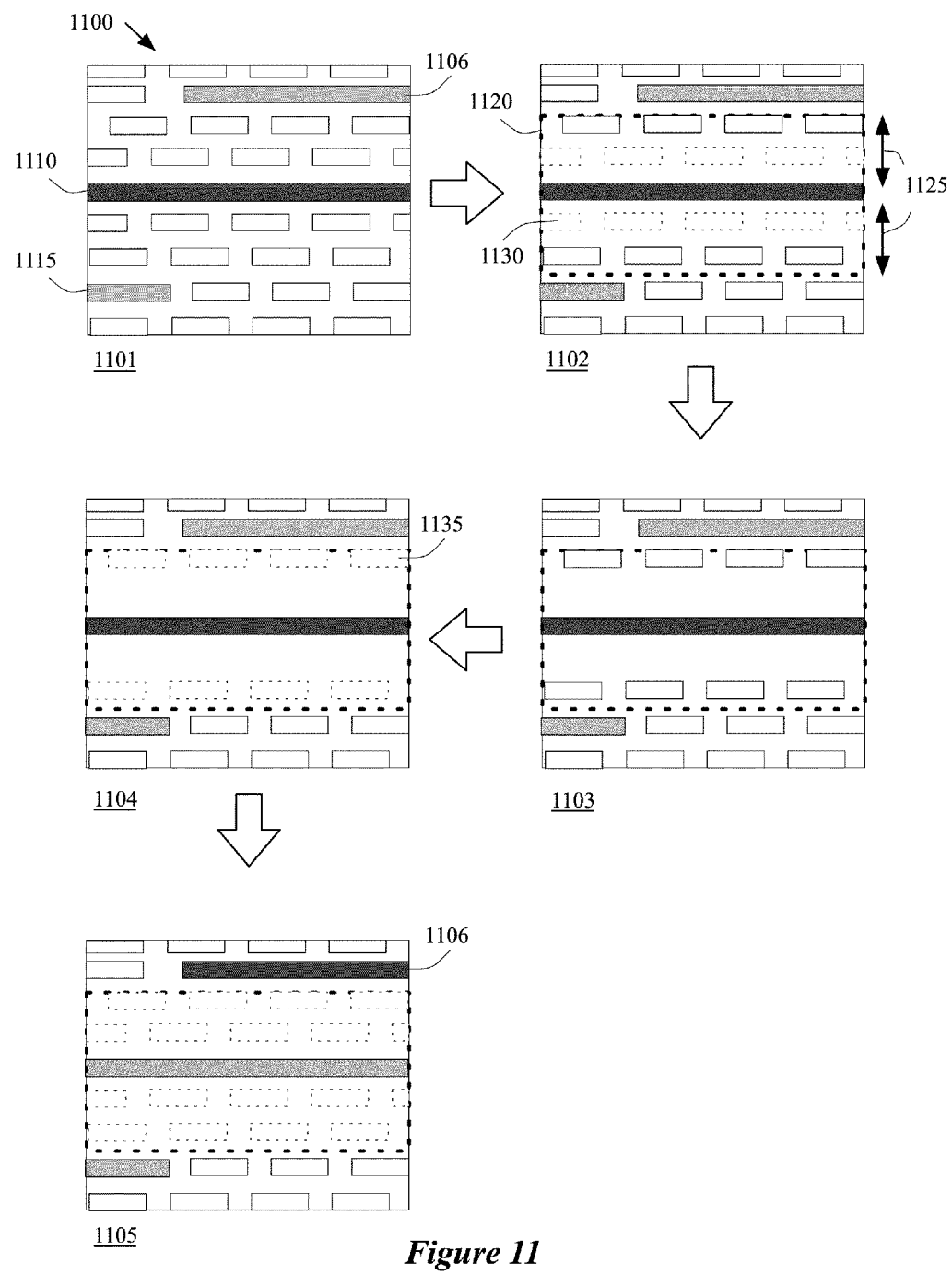
FIG. 11 conceptually illustrates a region of a design layout that is being changed.

An example operation of the fills trimmer 730 will now be described by reference to FIGS. 10 and 11. FIG. 10 conceptually illustrates a process 1000 that some embodiments perform to trim fills around critical nets. FIG. 11 illustrates a region 1100 of the design layout in five stages 1101-1105.

In some embodiments, the process 1000 illustrated in FIG. 10 is performed by the fills trimmer 730. The process 1000 starts when it receives or retrieves a design layout with several fills inserted and the result of timing analysis on the design layout. The process 1000 begins by identifying (at 1005) critical nets in the design layout. In this example operation, the critical nets finder 910 finds three critical nets 1106, 1110, and 1115 (illustrated in stage 1101 of FIG. 11) in a particular layer of the design layout as directed by the trimming controller 905. In some embodiments, the user may provide the criteria based on which to identify the critical nets via the user interface 705. For instance, the user may specify an amount of slack such that the process 1000 identifies only those critical nets that have more amounts of slacks than the specified amount.

The process 1000 then orders (at 1010) the identified critical nets based on a set of criteria. In some embodiments, the criteria include the lengths of the slacks that the identified critical nets have. For instance, the prioritizer 915 order the three critical nets 1106, 1110, and 1115 in the order of the longest slack to the shortest slack that these three critical nets have. In the example, the net 1110 has the longest slack, followed by the nets 1106 and 1115.

Next, the process 1000 selects (at 1015) a net from the ordered nets. In some embodiments, the process 1000 selects the first net in the ordered nets. The net selector 920 selects the net 1110 because the net 1110 has the longest slack. The net 1110 is depicted as a black rectangle to indicate the selection as shown FIG. 11.

The process 1000 then defines (at 1020) one or more regions around the net in which to trim the fills based on a set of trimming criteria. The trimming criteria include the locations and dimensions of the regions, the layers in which to define the regions, etc. For instance, the process 1000 defines a region to include all area of the particular layer that falls in within a certain distance from the selected net. The process 1000 may also define a region in an upper layer of the particular layer and a region in a layer that is below the particular layer. In some embodiments, the process 1000 uses a default set of trimming criteria or the trimming criteria provided by the user. The user can formulate different trimming strategies by varying the specifics of the trimming criteria. For instance, the user can vary the distance and/or number of layers above or below to trim fills. As shown in stage 1102 of FIG. 11, the net selector 920 defines a region 1120 within the region 1100 of the design layout. The net selector 920 defines the region 1120 using a distance 1125 provided by the user through the user interface 705.

The process 1000 then identifies (at 1025) the fills near the selected net. In some embodiments, the process 1000 identifies the fills that are closest to the selected net first. As shown in stage 1102 in FIG. 11, the trimmer 925 identifies and selects a set of fills 1130, which are depicted as thin dotted rectangles, that are closest to the net 1110.

The process 1000 then determines (at 1030) whether removing the identified fills will cause the design layout to violate a design rule. Specifically, the process 1000 in some embodiments determines whether the density of the defined (at 1020) region would fall below a minimum density required for the region. In the example, the design rule checker 1030 determines that removing the identified fills will not cause the region 1120's density to drop below the minimum density.

When the process 1000 determines (at 1030) that the density of the region would not fall below the minimum density required for the region, the process 1000 trims (1035) the identified fills from the region. Stage 1103 of FIG. 11 shows that the trimmer 925 has removed the set of fills 1130 from the region 1120.

The process 1000 then determines (at 1040) whether there are more fills left in the defined region. When the process 1000 determines (at 1040) that there are more fills left in the defined region, the process 1000 loops back to 1025 to identify more fills in the region to trim. Otherwise, the process 1000 proceeds to 1045, which will be described further below. Stage 1104 of FIG. 11 shows that there is a set of fills 1135 remaining in the region 1120. Thus, the trimmer 925 identifies and selects the fills 1135 because these fills are closest to the net 1110. Stage 1104 illustrates that the fills 1135 are selected.

When the process 1000 determines (at 1030) that the density of the region would fall below the minimum density required for the region, the process 1000 does not trim the identified fills but instead proceeds to 1045. At stage 1104, the rules checker 930 determines that the density of the region 1120 would drop below the minimum density required for the region. Thus, the trimmer 925 will not remove the fills 1135 in that case.

At 1045, the process 1000 determines whether there are more critical nets identified (at 1010) but have not had the fills near the nets trimmed. When the process 1000 determines (at 1045) that there are more such critical nets, the process loops back to 1015 to select another critical net. Stage 1105 of FIG. 11 illustrates that the net selector 920 has selected the net 1115 for the net 1106 has the next longest slack. When the process 1000 determines (at 1045) that there are no more such critical nets, the process loops back to 1015 to select another critical net, the process ends.

Figure 12:
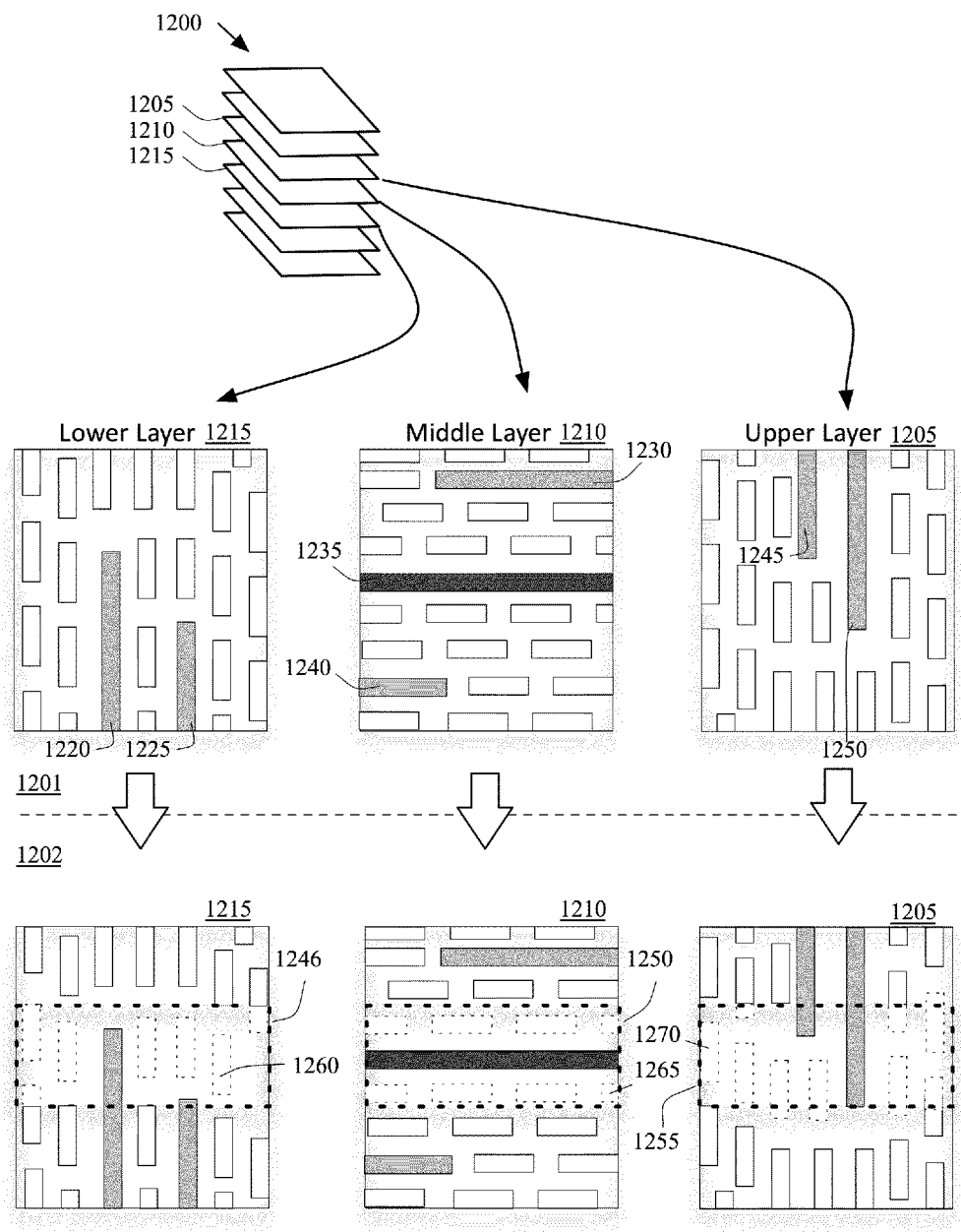
FIG. 12 conceptually illustrates several layers of a design layout that are being changed.

FIG. 12 conceptually illustrates a stack of layers 1200 of a design layout. Specifically, FIG. 12 illustrates in two stages 1201-1202 that, when trimming the fills in a region around a critical net in a particular layer, the trimming tool of some embodiments can also trim the fills in the corresponding regions in the layers that are above and below the particular layer. As shown, the stack of layers 1200 includes three layers 1205, 1210, and 1215.

Stage 1201 illustrates the three layers 1205, 1210, and 1215. As shown in the stack 1200, the layer 1205 is upper layer of the three layers. The layer 1210 is middle layer and the layer 1215 is the lower layer. The lower layer 1215 includes nets 1220 and 1225. The middle layer 1210 includes nets 1230, 1235, and 1240. The upper layer 1205 includes nets 1245 and 1250. All three layers have fills inserted between and around the nets. At this stage, the net 1235 of the middle layer 1210 is depicted in darker grey to indicate that the trimming tool has selected the net 1235 around which to trim the fills.

The next stage 1202 illustrates that the trimming tool has defined a region 1250 around the selected critical net 1235 and has also selected a set of fills 1260 to trim. It is assumed that the trimming tool has received a user input that specifies that the trimming tool should trim the corresponding regions 1246 and 1255 in the lower layer 1215 and the upper layer 1205, respectively. This stage shows that the trimming tool has selected a set of fills 1260 from the region 1246 of the lower layer 1215, a set of fills 1265 from the region 1250 of the middle layer 1210, and a set of fills 1270 from the region 1255 of the upper layer 1205. This stage shows that only portions of the fills are removed from the regions when the fills do not fall in the regions entirely.

Several examples of generating a design layout that includes a set of fills by first inserting the fills between the nets in the design layout and then trimming the fills have been described in Section I. The following Section II will now describe examples of efficiently changing a design layout.

II. Efficient Processing of Design Layout

As mentioned above, some embodiments provide a method for efficiently changing a design layout by incrementally processing the design layout after a change is made to the design layout and thereby avoiding processing the entire of the design layout every time a change is made to the design layout.

Figure 13:
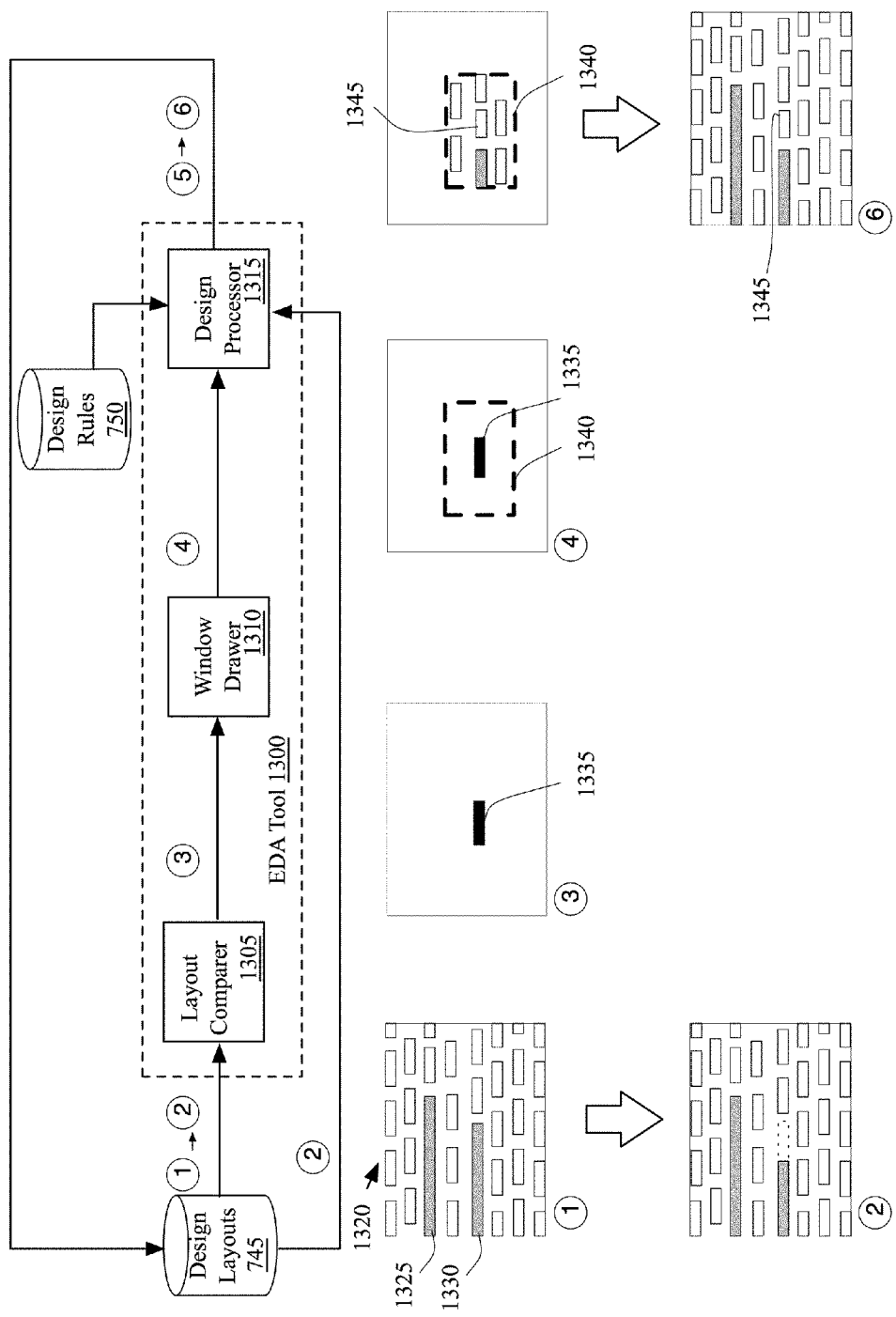
FIG. 13 conceptually illustrates example architecture for an EDA tool of some embodiments and a region of a design layout that is being changed by the EDA tool.

FIG. 13 conceptually illustrates example architecture of an EDA tool 1300 that employs the method to efficiently change a design layout. The EDA tool 1300 in some embodiments compares a design layout that has been just changed with the same design layout before the change was made in order to identify the change. This figure also illustrates the design layouts 745 and the design rules 750. This figure also illustrates that a region 1320 in a layer of a design layout. As shown, the EDA tool 1300 includes a layout comparer 1305, a window drawer 1310, and a design processor 1315.

In some embodiments, a design layout is modified by another module (not shown) of the EDA tool 1300 such as placing and routing module 710 described above by reference to FIG. 7. The module that modified the design layout also stores the design layout before modifying the design layout.

The layout comparer 1305 identifies a change in a design layout that has been modified. In some embodiments, the layout comparer 1305 identifies the change by comparing the modified design layout and the original design layout. Specifically, the layout comparer 1305 in some such embodiments compares the shapes in the original design layout and the shapes in the modified layout. The layout comparer 1305 identifies the changed shapes as changes to the design layout.

The layout comparer 1305 in some embodiments compares the shapes by comparing (1) the areas in the original design layout that all the shapes in the original design layout occupy and (2) the areas in the modified design layout that all the shapes in the modified design layout occupy. By comparing these areas, the layout comparer 1305 identifies, as the changes to the layout, the areas in which the shapes in the original and modified design layouts do not overlap. The areas in the design layout in which (1) only the shapes of the original design layout occupy or (2) only the shapes of the modified design layout occupy are identified as changes to the design layout. In other words, changes are the areas in the design layout that are either occupied by the shapes of the original design layout or by the shapes of the modified design layout but not by both. In some embodiments, the areas are defined in the coordinates (e.g., in the Cartesian coordinate) of the vertices of the areas.

In some embodiments, the layout comparer 1305 compares all the shapes regardless of what the shapes represent. That is, the layout comparer 1305 compares all the components, nets, and fills. In other embodiments, the layout comparer 1305 compares only the shapes that represent components and nets of the IC for which the design layout is being prepared. That is, the comparer 1305 in these embodiments does not compare shapes that represent fills.

The window drawer 1310 draws a window around a change identified by the layout comparer 1305. The window drawn by the window drawer 1310 defines a region in the modified design layout. In some embodiments, the window drawer 1310 draws a window to cover a region that falls in a certain distance from the change in the design layout. A user of the EDA tool 1300 may specify this distance through a user interface (not shown).

The design processor 1315 performs one or more design operations to the window drawn by the window drawer 1310. As mentioned above, the design operations include, for example, placing and routing the features, verifying the region against a set of design rules, performing a timing analysis on the region, inserting fills in the region, etc. By performing the design operations only on the window, the design processor 1315 avoids performing the operations on the entire of the design layout and thereby saves computing resources (e.g., CPU cycle, memory, etc.) and time to perform those operations.

Figure 14:
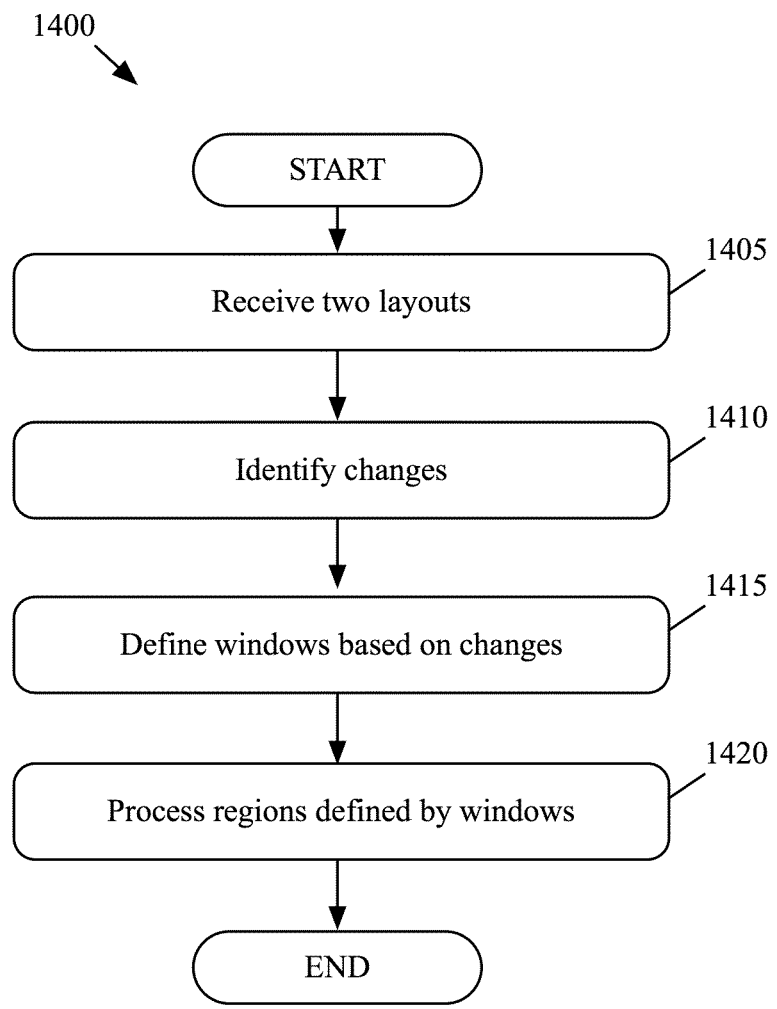
FIG. 14 conceptually illustrates a process that some embodiments perform to efficiently change a design layout.

An example operation of the EDA tool 1300 will now be described by reference to FIG. 14. FIG. 14 conceptually illustrates a process 1400 that some embodiments perform to efficiently perform a set of design operations to a design layout. The process 1400 in some embodiments is performed by the EDA tool 1300. The process 1400 in some embodiments starts when a design layout is modified.

The process 1400 begins by receiving (at 1405) or retrieving two design layouts—an original design layout and a modified design layout. The two design layouts are the same design layout except the modified design layout includes the changes that have been made to the original design layout. For instance, FIG. 13 shows that the original design layout is labeled with an encircled number 1. The modified design layout is labeled with an encircled number 2. The original and modified design layouts 1 and 2 have two nets 1325 and 1330. These layouts also have fills, which are depicted as solid rectangles, inserted between and around the nets 1325 and 1330. From the original design layout 1 to the modified design layout 2, the net 1330 has been shortened from the right end. The removed portion of the net 1330 is depicted as a dotted rectangle. The layout comparer 1305 receives the two layouts 1 and 2.

Next, the process 1400 identifies (at 1410) the changes to the original design layout. In some embodiments, the process 1400 identifies the changes by comparing the original and modified design layouts. The layout comparer 1305 compares the design layouts 1 and 2 and identifies that the area depicted as the dotted rectangle shown in the modified design layout 2 is the change. A design layout that is labeled with an encircled number 3 shows the identified change 1335, which is depicted as a sold black rectangle.

The process 1400 then defines (at 1415) a set of windows based on the identified changes. Different embodiments define the windows differently. For instance, in some embodiments, the process 1400 defines the windows to cover regions that fall within a certain distance from the changes in the design layout. As shown by the design layout that is labeled with an encircled number 4, the window drawer 1310 has drawn a window 1340, which is depicted as a thick dotted rectangle, around the identified change 1335. The window 1340 defines a border for a region that is within a certain distance from the change 1335.

Next, the process 1400 processes (at 1420) the regions defined by the windows. The process 1400 processes the regions by performing a set of design operations on the regions. For instance, the design processor 1315 places fills in the region defined by the window 1340 as shown by the design layout that is labeled with an encircled number 5. In this example, the design processor 1315 places only a fill 1345 and does not change the other fills in the window 1340.

By placing fills only in the region, the design processer 1315 has avoided placing fillings in the entire of the design layout and thereby has saved computing resources and time to place fillings in the regions of the design layout other than the region defined by the window 1340. As shown by a design layout that is labeled with an encircled number 6, the design processor 1315 generates a processed design layout by replacing the corresponding region of the modified design layout 2 with the region defined by the window 1340 that includes the fill 1345 that has been placed just now. The design processor 1315 stores the processed design layout 6 in the design layouts 745.

Figure 15:
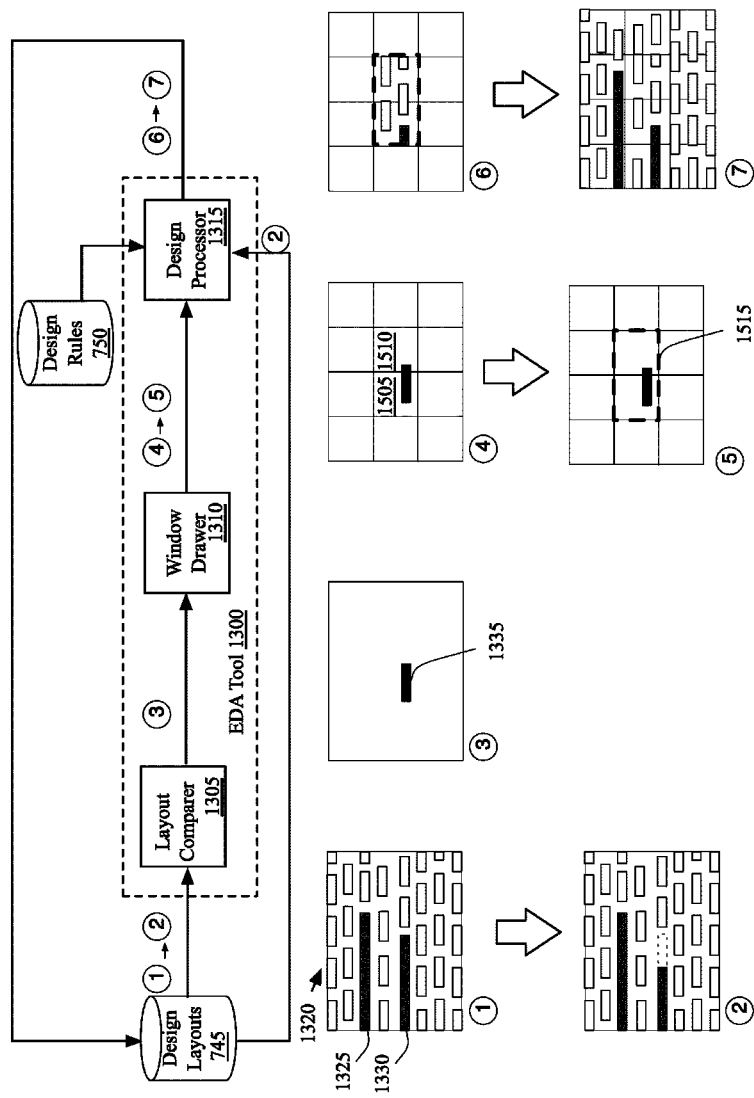
FIG. 15 conceptually illustrates example architecture for an EDA tool of some embodiments and a region of a design layout that is being changed by the EDA tool.

FIG. 15 illustrates the EDA tool 1300 described above by reference to FIG. 13. Specifically, this figure illustrates that the window drawer 1310 of the EDA tool 1300 in some embodiments uses grids to define windows around changes in a design layout.

In some embodiments, the window drawer 1310 draws windows around the changes to a design layout using grids. Each grid has a dimension that defines a minimum region that should be considered when performing a design operation. For instance, a grid has a rectangular shape with a dimension that covers the minimum region in which an EDA tool should evaluate all the shapes when placing fills. The dimension of the grid (i.e., the gap between vertical gridlines and between horizontal gridlines) is pre-defined or the user may provide the dimension through a user interface (not shown) in some embodiments In some embodiments, the window drawer 1310 divides the design layout into the grids. The window drawer 1310 then identifies all grids that includes at least a portion of changes that have been found by the layout comparer 1305. The window drawer 1310 then draws windows that encompass the identified grids.

An example operation of the EDA tool 1300, of which the windows drawer 1310 uses grids to draw windows around the identified changes to the design layout will now be described. The original and modified design layouts 1 and 2 are the same as the ones illustrated in FIG. 13. The layout comparer 1305 compares the design layouts 1 and 2 and identifies that the area defined by the dotted rectangle shown in the modified design layout 2 is the change. A design layout that is labeled with an encircled number 3 shows the identified change 1335, which is depicted as a sold black rectangle.

Then, the window drawer 1310 draws gridlines to define grids in the design layout as shown in the design layout that is labeled with an encircled number 4. The window drawer 1310 then identifies that grids 1505 and 1510 includes at least a portion of the change 1335. The window drawer 1310 then draws a window 1515 as shown in the design layout that is labeled with an encircled number 5. As shown, the window 1515 encloses the grids 1505 and 1510.

Next, the design processor 1315 places fills in the region defined by the window 1515 as shown by a design layout that is labeled with an encircled number 6. As shown by a design layout that is labeled with an encircled number 7, the design processor 1315 then generates a processed design layout by replacing the corresponding region of the modified design layout 2 with the region defined by the window 1515 that includes the fills that have been placed just now. The design processor 1315 stores the processed design layout 7 in the design layouts 745.

Figure 16:
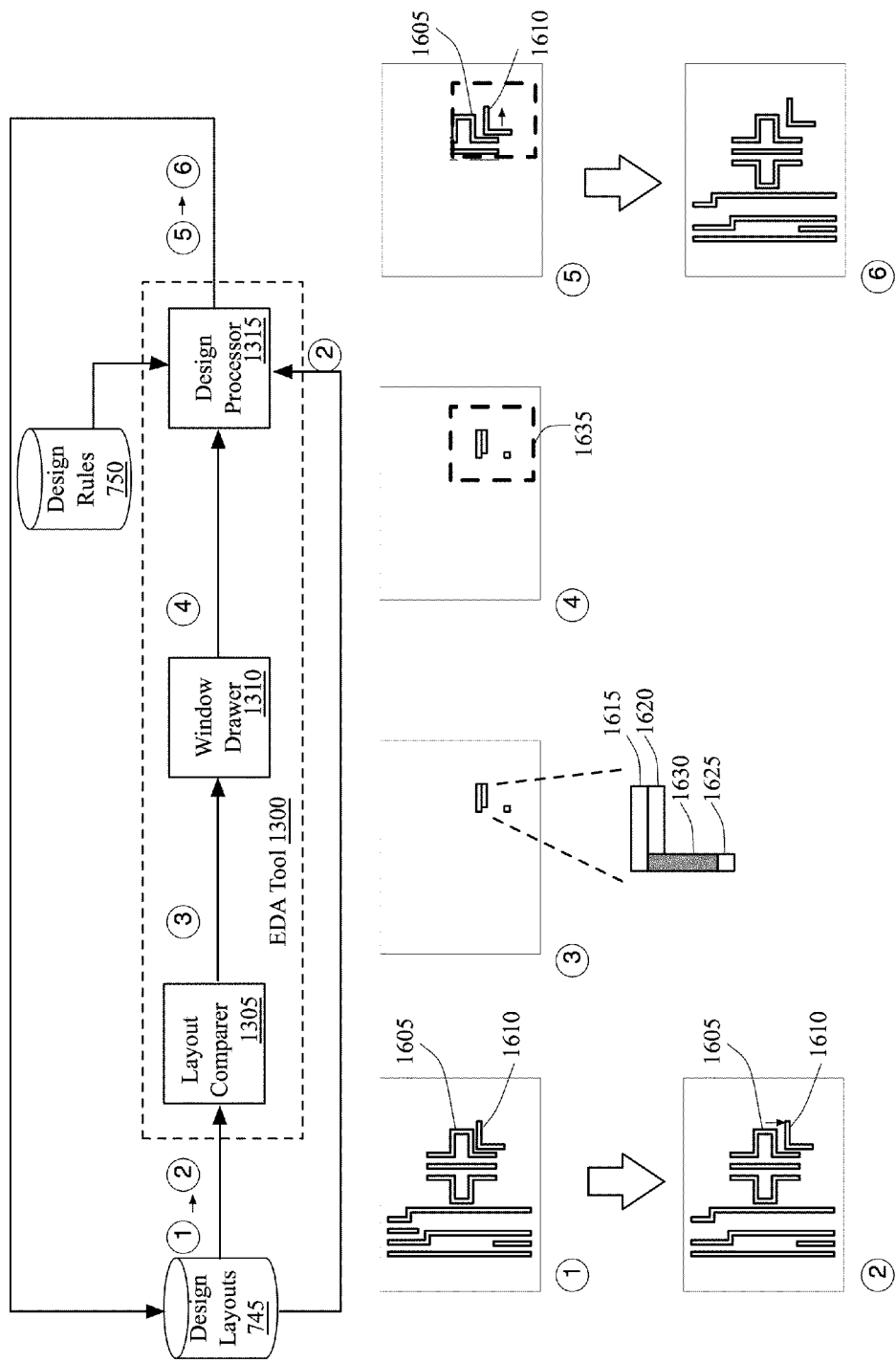
FIG. 16 conceptually illustrates example architecture for an EDA tool of some embodiments and a region of a design layout that is being changed by the EDA tool.

FIG. 16 illustrates the EDA tool 1300 described above by reference to FIG. 13. Specifically, this figure illustrates that design operations that the design processor 1315 of the EDA tool 1300 performs on a window drawn by the window drawer 1310 are verifying the region defined by the window against a design rule and fixing a design violation.

An example operation of the EDA tool 1300, of which the design processor 1315 verifies a region defined by a window drawn by the window drawer 1310 against a design rule and fixes a design violation will now be described. The layout comparer 1305 receives an original design layout that is labeled with an encircled number 1 and a modified design layout that is labeled with an encircled number 2. As shown, the original and modified design layouts 1 and 2 have several nets including nets 1605 and 1610. From the original design layout 1 to the modified design layout 2, the net 1330 has been moved down vertically because the horizontal portion of the net 1610 was positioned at a location that is within a required minimum distance between two nets from the net 1605.

Next, the layout comparer 1305 compares the original and modified design layouts 1 and 2 to identify changes. A design layout that is labeled with an encircled number 3 shows the changes. The changes are three areas 1615, 1620, and 1625, depicted as rectangles. The area 1615 is an area occupied by the horizontal portion of the net 1610 in the original design layout 1. Because the net 1610 was moved down vertically, the area 1615 was occupied only in the original design layout 1. The areas 1620 and 1625 are areas occupied by portions of the net 1610 only in the modified design layout. An area 1630 is an area occupied by a portion of the net 1610 in both the original design layout 1 and the modified design layout 2. Therefore, the layout comparer 1305 does not identify area 1630 as a change that was made from the original design layout 1 to the modified design layout 2.

Based on the three areas 1615, 1620, and 1625 that represent the changes from the original design layout 1 to the modified design layout 2, the window drawer 1310 draws a window 1635 as shown in a design layout that is labeled with an encircled number 4. The window 1340 defines a region that is within a certain distance from the changes 1615, 1620, and 1625.

Next, the design processor 1315 verifies the region of the modified design layout 2 defined by the window 1635 against a set of design rules. As shown in a design layout that is labeled with an encircled number 5, the region defined by the window 1635 includes a portion of the net 1605 and the net 1610. In this example, the design processor 1315 finds that the vertical portion of the net 1610 is positioned at a location that is within a required minimum distance between two nets from the net 1605.

The design processor 1315 then moves the net 1605 to the right in order to fix this design violation. By verifying only the region defined by the window 1635, the design processer 1315 has avoided verifying the entire of the design layout and thereby has saved computing resources and time to verify the regions of the design layout other than the region defined by the window 1635. As shown by a design layout that is labeled with an encircled number 6, the design processor 1315 generates a processed design layout by replacing the corresponding region of the modified design layout 2 with the region defined by the window 1635 that includes the fix to the design violation. The design processor 1315 stores the processed design layout 6 in the design layouts 745.

Figure 17:
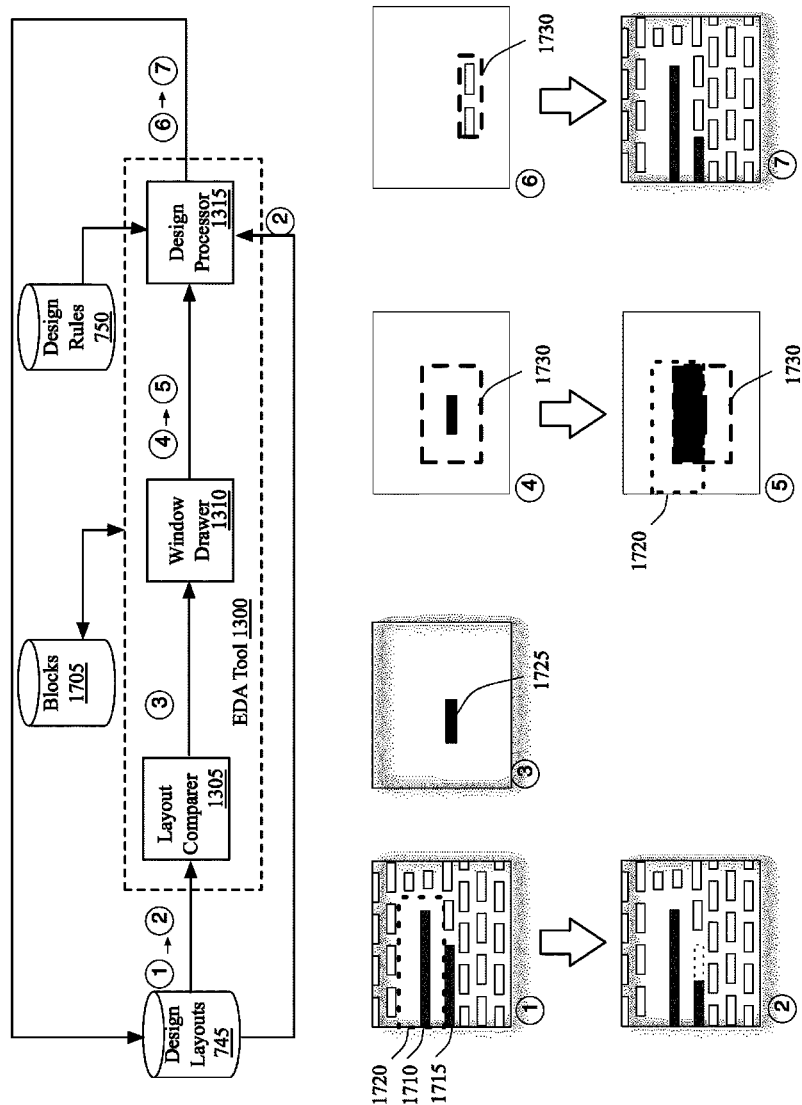
FIG. 17 conceptually illustrates example architecture for an EDA tool of some embodiments and a design layout that has a blocked region.

FIG. 17 illustrates the EDA tool 1300 described above by reference to FIG. 13. Specifically, this figure illustrates that the EDA tool 1300 may set and use blocks to prevent blocked regions of the design layout from being processed again. FIG. 17 also illustrates blocks 1705 in addition to the design layouts 745, the design rules 750, and the EDA tool 1300.

In some embodiments, the EDA tool 1300 define blocks in the design layout. When the EDA tool 1300 performs design operations on a design layout that contains blocks, the EDA tool 1300 does not perform design operations on the regions covered by the blocks. In some embodiments, blocks prevent any design operation from being performed on the regions covered by blocks. In some such embodiments, each block is tailored to prevent only a particular design operation from being performed on a region covered by the block. For instance, the EDA tool 1300 may verify a blocked area against a set of design rules but may not place fills in the blocked area.

As mentioned above, the window drawer 1310 draws a window around a change identified by the layout comparer 1305. However, when the region defined by the window partially falls within a block, the window drawer 1310 excludes the portion of the region that falls in the block from the window. When the region that would be defined by the window completely falls within a block, the window drawer 1310 does not draw a window for the change.

Figure 18:
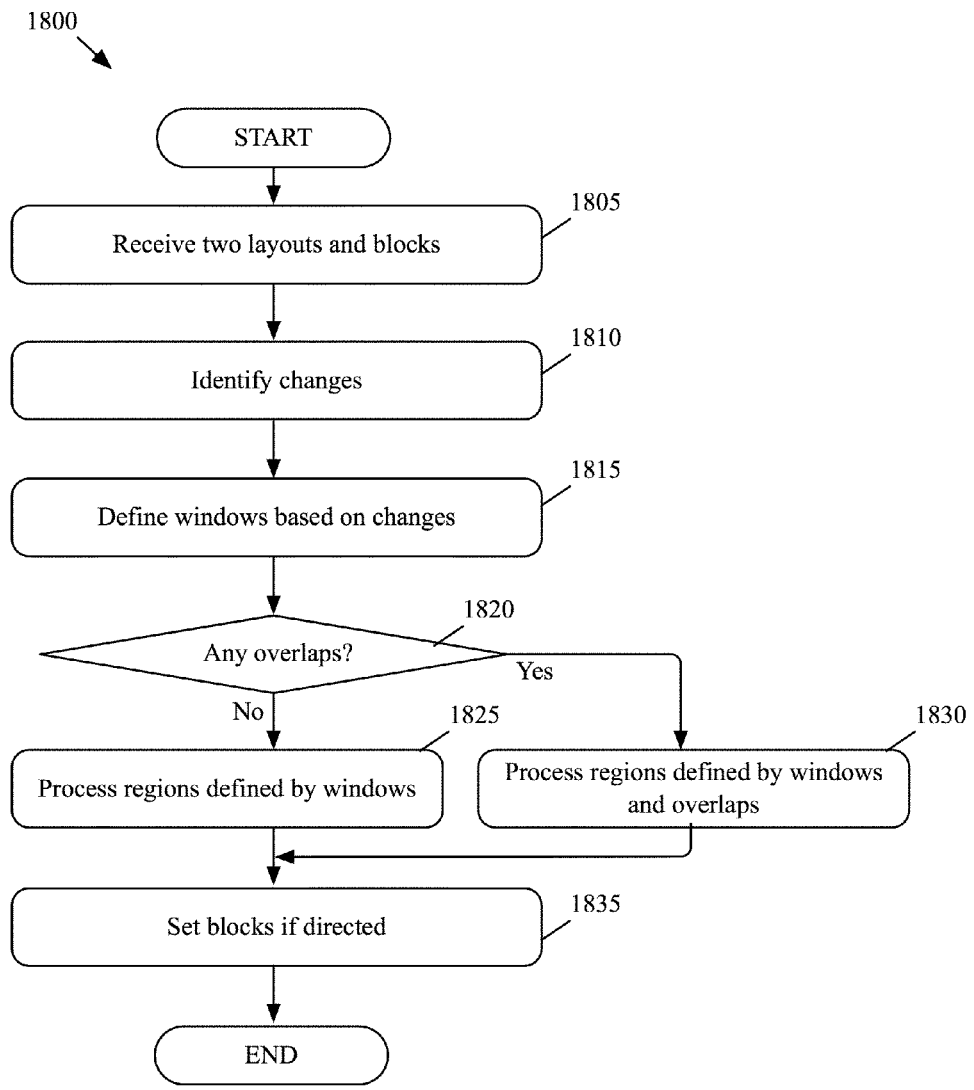
FIG. 18 conceptually illustrates a process that some embodiments perform to change a design layout that has a blocked region.

An example operation of the EDA tool 1300 that sets and uses blocks will now be described by reference to FIG. 18. FIG. 18 conceptually illustrates a process 1800 that some embodiments perform to efficiently perform a set of design operations to a design layout that includes one or more blocks. The process 1800 in some embodiments is performed by the EDA tool 1300. The process 1400 in some embodiments starts when a design layout is modified.

The process 1800 begins by receiving (at 1805) or retrieving two design layouts—an original design layout and a modified design layout. The two design layouts are the same design layout except the modified design layout includes the changes that have been made to the original design layout. For instance, FIG. 17 shows that the original design layout is labeled with an encircled number 1. The modified design layout is labeled with an encircled number 2. The original and modified design layouts 1 and 2 have two nets 1710 and 1715. These layouts has a block 1720, depicted as a thick dotted rectangle, that is set to cover a region around the net 1710. These layouts also have fills, which are depicted as solid rectangles, inserted between and around the nets 1710 and 1715 except the region defined by the block 1720 as shown.

From the original design layout 1 to the modified design layout 2, the net 1715 has been shortened from the right end. The removed portion of the net 1715 is depicted as a dotted rectangle. The layout comparer 1305 receives the two layouts 1 and 2.

Next, the process 1800 identifies (at 1810) the changes to the original design layout by comparing the original and modified design layouts. The layout comparer 1305 compares the design layouts 1 and 2 and identifies that the area depicted as the dotted rectangle in the modified design layout 2 is the change. A design layout that is labeled with an encircled number 3 shows the identified change 1725 that is depicted as a solid black rectangle.

The process 1800 then defines (at 1815) a set of windows based on the identified changes. As shown by the design layout that is labeled with an encircled number 4, the window drawer 1310 has drawn a window 1730, which is depicted as a thick dotted rectangle, around the identified change 1725. The window 1730 defines a region that is within a certain distance from the change 1725.

Next, the process 1800 determines (at 1820) whether there is an overlap between the windows and the blocks. That is, the process determines for each window whether a region defined by the window is covered at least partially by a block. In some embodiments, the process 1800 makes this determination using the coordinates of the vertices of the block and the window.

When the process 1800 determines (at 1820) that there is no overlap between the windows and the blocks, the process 1800 proceeds to 1825 to process regions defined by the windows. The process 1800 processes (at 1825) the regions by performing a set of design operations on the regions. The process 1800 then proceeds to 1835 which will be described further below.

When the process 1800 determines (at 1820) that there is an overlap between the windows and the blocks, the process 1800 processes (at 1830) regions defined by the windows except the portions of regions that are covered by one or more blocks. As shown by a design layout that is labeled with an encircled number 5, the windows drawer 1310 determines that the window 1730 partially overlaps with the block 1720. The overlapped area is depicted as a grey rectangle. The window drawer 1310 redraws the window 1340 such that the window 1340 excludes the overlapped area. The design processor 1315 then places fills in the region defined by the redrawn window as shown in a design layout that is labeled with an encircled number 6. As shown by a design layout that is labeled with an encircled number 7, the design processor 1315 generates a processed design layout by replacing the corresponding region of the modified design layout 2 with the region defined by the redrawn window 1730 that includes the fills that have been placed just now.

Next, the process 1800 sets (at 1835) new blocks if so directed. In some embodiments, the process 1800 creates blocks for the design layouts when the process 1800 receives an input from a user through a user interface (not shown).

Figure 19:
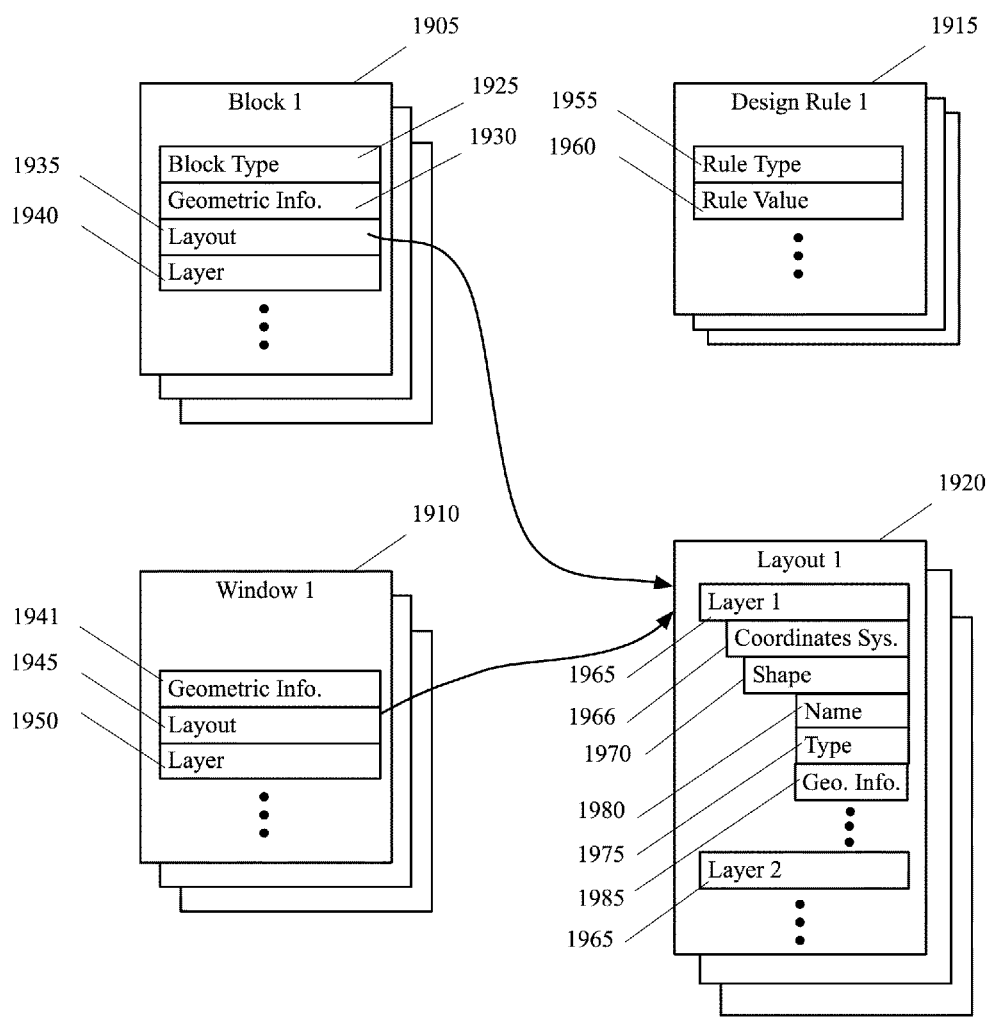
FIG. 19 conceptually illustrates several data structures that some embodiments use.

FIG. 19 illustrates example data structures for design layouts, design rules, blocks, and windows used by some embodiments of the invention. A data structure 1905 for a block in some embodiments includes a block type 1925 and geometric information 1930 for the block. The block type specifies the kind of design operations that should be prevented from performing on the region defined by the block. The geometric information 1930 is information to construct the block on the design layout. For instance, the geometric information may include a set of coordinates that define the block. The data structure 1905 also includes a reference 1935 to the design layout and an identification 1940 of the layer of the design layout in which the block is set.

A data structure 1910 for a window in some embodiments includes geometric information 1941, which is information used to draw the window on the design layout. The data structure 1910 also includes a reference 1945 to the design layout and an identification 1950 of the layer of the design layout in which the window is drawn.

A data structure 1915 for a design rule in some embodiments includes a rule type 1955 (e.g., a minimum density rule, a minimum space rule, a minimum width rule, a minimum area rule, a minimum edge rule, etc.) and a rule value 1960 that corresponds to the rule type (e.g., a minimum density for the design layout or a region of the design layout, a minimum distance between two shapes, a minimum width of a shape, a minimum size of a shape, a minimum length of edges that form an inward corner, etc.).

A data structure 1920 for a design layout in some embodiments includes a list of layers 1965 that are in the design layout. Each of the layers in the list includes information 1966 about the layer's coordinates system and a list of shapes 1970 in the layer. Each shape in the list of shapes includes a shape type 1975, a shape name 1980, and geometric information 1985. The shape type defines what the shape represents—e.g., a net, a fill, an IC component. The shape name is a set of alphanumeric characters that define the name of the shape. The geometric information is information used to construct the shape on the layer of the design layout.

III. Electronic System

Many of the above-described features and applications are implemented as software processes that are specified as a set of instructions recorded on a machine readable storage medium (also referred to as machine readable medium). When these instructions are executed by one or more processing unit(s) (e.g., one or more processors, cores of processors, or other processing units), they cause the processing unit(s) to perform the actions indicated in the instructions. Examples of machine readable media include, but are not limited to, CD-ROMs, flash drives, RAM chips, hard drives, EPROMs, etc. The machine readable media does not include carrier waves and electronic signals passing wirelessly or over wired connections.

In this specification, the term "software" is meant to include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 20:
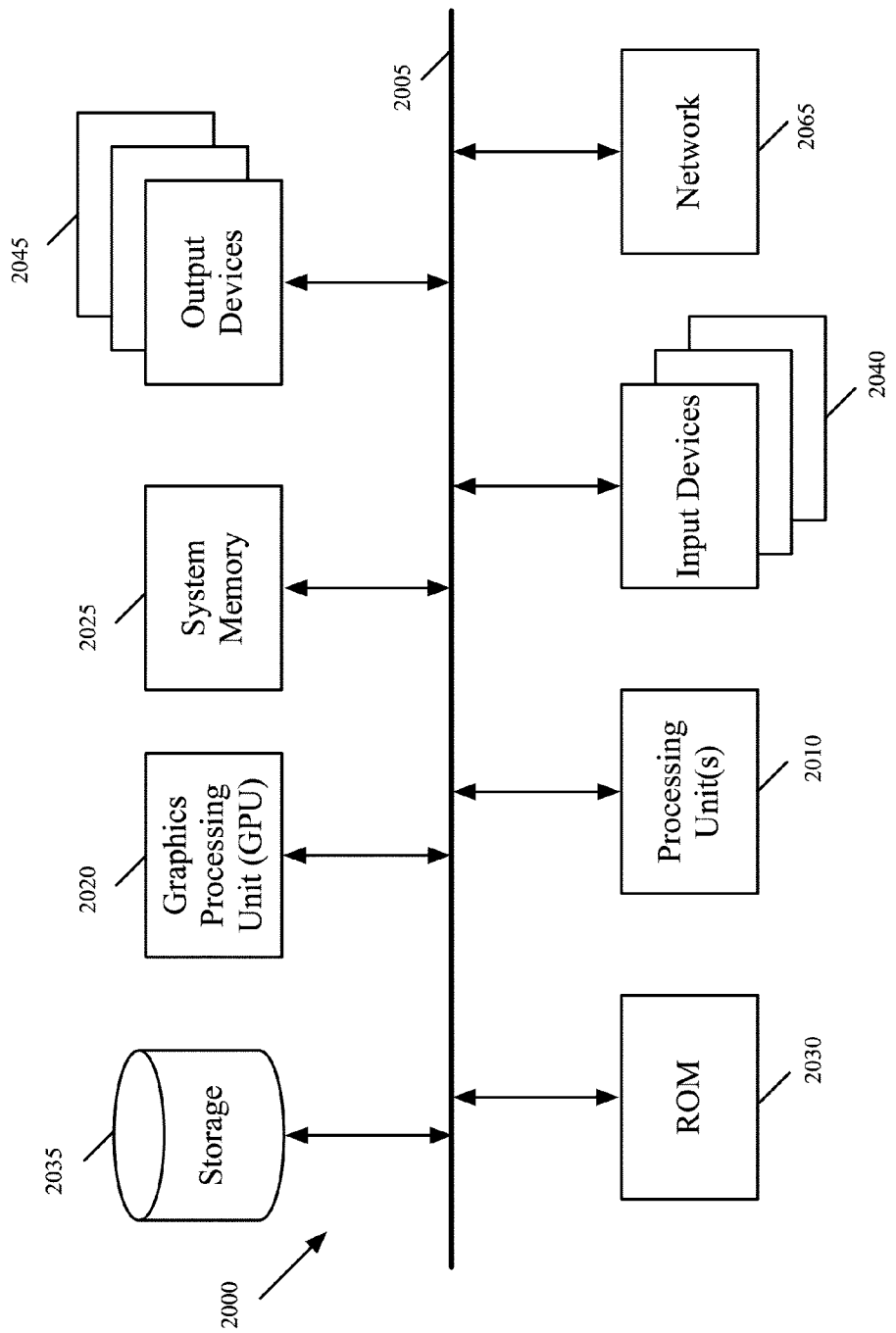
FIG. 20 illustrates an electronic system with which some embodiments of the invention are implemented.

FIG. 20 conceptually illustrates an electronic system 2000 with which some embodiments of the invention are implemented. The electronic system 2000 may be a computer, phone, PDA, or any other sort of electronic device. Such an electronic system includes various types of computer readable media and interfaces for various other types of computer readable media. Electronic system 2000 includes a bus 2005, processing unit(s) 2010, a graphics processing unit (GPU) 2020, a system memory 2025, a read-only memory 2030, a permanent storage device 2035, input devices 2040, and output devices 2045.

The bus 2005 collectively represents all system, peripheral, and chipset buses that communicatively connect the numerous internal devices of the electronic system 2000. For instance, the bus 2005 communicatively connects the processing unit(s) 2010 with the read-only memory 2030, the GPU 2020, the system memory 2025, and the permanent storage device 2035.

From these various memory units, the processing unit(s) 2010 retrieve instructions to execute and data to process in order to execute the processes of the invention. The processing unit(s) may be a single processor or a multi-core processor in different embodiments. Some instructions are passed to and executed by the GPU 2020. The GPU 2020 can offload various computations or complement the image processing provided by the processing unit(s) 2010. In some embodiments, such functionality can be provided using CoreImage's kernel shading language.

The read-only-memory (ROM) 2030 stores static data and instructions that are needed by the processing unit(s) 2010 and other modules of the electronic system. The permanent storage device 2035, on the other hand, is a read-and-write memory device. This device is a non-volatile memory unit that stores instructions and data even when the electronic system 2000 is off. Some embodiments of the invention use a mass-storage device (such as a magnetic or optical disk and its corresponding disk drive) as the permanent storage device 2035.

Other embodiments use a removable storage device (such as a floppy disk, flash drive, or ZIP® disk, and its corresponding disk drive) as the permanent storage device. Like the permanent storage device 2035, the system memory 2025 is a read-and-write memory device. However, unlike storage device 2035, the system memory is a volatile read-and-write memory, such a random access memory. The system memory stores some of the instructions and data that the processor needs at runtime. In some embodiments, the invention's processes are stored in the system memory 2025, the permanent storage device 2035, and/or the read-only memory 2030. For example, the various memory units include instructions for processing multimedia clips in accordance with some embodiments. From these various memory units, the processing unit(s) 2010 retrieve instructions to execute and data to process in order to execute the processes of some embodiments.

The bus 2005 also connects to the input and output devices 2040 and 2045. The input devices enable the user to communicate information and select commands to the electronic system. The input devices 2040 include alphanumeric keyboards and pointing devices (also called "cursor control devices"). The output devices 2045 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 20, bus 2005 also couples electronic system 2000 to a network 2065 through a network adapter (not shown). In this manner, the electronic system (e.g., a computer) can be a part of a network of such devices (such as a local area network ("LAN"), a wide area network ("WAN"), or an Intranet, or a network of networks, such as the Internet. Any or all components of electronic system 2000 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "machine readable medium" and "machine readable media" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 1, 3, 5, 10, 14, and 18) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process.

What is claimed is:

1. A computer-implemented method for performing a design operation on a circuit design layout, the method comprising:
   at a computer, receiving a first design layout comprising a first set of shapes and a second design layout comprising a second set of shapes and a plurality of sections;
   comparing the first design layout with the second design layout to identify an area of the second design layout that differs from a corresponding area of the first design layout in that one of the areas comprises a portion of a shape that the other area does not have;
   identifying a set of the sections of the second design layout which include the identified area of the second design layout; and
   performing a design operation only on the identified set of sections of the second design layout.

2. The method of claim 1, wherein performing the design operation comprises verifying the identified region against a design rule.

3. The method of claim 1, wherein performing the design operation comprises checking density of the identified region.

4. The method of claim 1, wherein performing the design operation comprises placing metal fills in the identified region.

5. The method of claim 1, wherein the first and second design layouts are different versions of the same design layout.

6. The method of claim 1, wherein the first and second design layouts have a same dimension.

7. The method of claim 1, wherein a shape in a design layout represents at least one of a net, a via, a pin, and a fill.

8. A non-transitory machine readable medium storing a program for performing design operations on a circuit design layout, the program comprising sets of instructions for:
   modifying a first set of shapes of an original circuit design layout to generate a modified circuit design layout comprising a second set of shapes and a plurality of sections;
   comparing the original circuit design layout with the modified circuit design layout to identify a set of sections of the modified circuit design layout, said set of sections including a portion of a shape in the modified circuit design layout that has been changed from the original circuit design layout; and
   performing a set of metal fill placement operations only on the identified set of sections of the modified circuit design layout.

9. The machine readable medium of claim 8, wherein the set of instructions for modifying the first set of shapes comprises a set of instructions for reshaping at least one shape in the first set of shapes in the circuit design layout.

10. The machine readable medium of claim 8, wherein the set of instructions for modifying the first set of shapes comprises a set of instructions for adding at least a portion of at least one shape to the circuit design layout.

11. The machine readable medium of claim 8, wherein the set of instructions for modifying the first set of shapes comprises a set of instructions for removing at least a portion of at least one shape in the first set of shapes from the circuit design layout.

12. The machine readable medium of claim 8, wherein the changed region of the modified circuit design layout comprises an area of the modified circuit design layout that is within a certain distance from the portion of the shape.

13. The machine readable medium of claim 8, wherein the program further comprises a set of instructions for defining a blocked region in the original circuit design layout, wherein the set of instructions for performing the set of metal fill placement operations comprises a set of instructions for excluding any portion of the identified region from the identified region when the portion overlaps with the blocked region.

14. The machine readable medium of claim 13, wherein the program further comprises a set of instructions for receiving user inputs, wherein the set of instructions for defining the blocked region comprises a set of instructions for defining the blocked region based on the user inputs.

15. The machine readable medium of claim 8, wherein the set of metal fill placement operations includes modifying the modified circuit design layout.

16. The non-transitory machine readable medium of claim 8, wherein the set of metal fill placement operations includes a density checking operation.

17. A system comprising:
   a processor for executing sets of instructions; and
   a memory for storing a computer program for performing design operations, the program comprises sets of instructions for:
      storing a copy of a circuit design layout before a shape in a circuit design layout is modified;
      identifying sections of the modified circuit design layout that contain the modified shape by comparing the modified circuit design layout with the stored copy of the circuit design layout; and
      performing a set of design rule checking (DRC) operations only on set of sections of the circuit design layout that include the identified location.

18. The system of claim 17, wherein the program further comprises a set of instructions for defining a region that includes the identified location of the modified shape.

19. The system of claim 18, wherein the defined region is within a certain distance from the identified location.

20. The system of claim 18, wherein the set of instructions for defining the region comprises sets of instructions for:
   dividing the design layout into a set of grids; and
   using grids to define the region.

21. The system of claim 18, wherein the program further comprises a set of instructions for modifying another shape that is in the region based on results of performing the DRC operations.

* * * * *